US008995582B2

(12) United States Patent
Markman

(10) Patent No.: US 8,995,582 B2
(45) Date of Patent: Mar. 31, 2015

(54) PRIORI TRAINING IN A MOBILE DTV SYSTEM

(75) Inventor: Ivonete Markman, Carmel, IN (US)

(73) Assignee: Thomson Licensing, Issy les Moulineaux (FR)

( * ) Notice: Subject to any disclaimer, the term of this patent is extended or adjusted under 35 U.S.C. 154(b) by 63 days.

(21) Appl. No.: 13/805,780

(22) PCT Filed: Jun. 25, 2010

(86) PCT No.: PCT/US2010/001828
§ 371 (c)(1),
(2), (4) Date: Dec. 20, 2012

(87) PCT Pub. No.: WO2011/162735
PCT Pub. Date: Dec. 29, 2011

(65) Prior Publication Data
US 2013/0101051 A1  Apr. 25, 2013

(51) Int. Cl.
  *H03D 1/00* (2006.01)
  *H04L 27/06* (2006.01)
  *H04N 19/65* (2014.01)
  *H03M 13/27* (2006.01)
  *H03M 13/29* (2006.01)
  *H04L 1/00* (2006.01)

(52) U.S. Cl.
  CPC ......... *H04N 19/00854* (2013.01); *H03M 13/27* (2013.01); *H03M 13/2732* (2013.01); *H03M 13/2936* (2013.01); *H03M 13/2945* (2013.01); *H03M 13/2957* (2013.01); *H04L 1/005* (2013.01); *H04L 1/0071* (2013.01); *H04L 1/0055* (2013.01); *H04L 1/0057* (2013.01); *H04L 1/006* (2013.01)
  USPC .......................................... 375/341; 375/265

(58) Field of Classification Search
  USPC ................................................. 375/341, 265
  See application file for complete search history.

(56) References Cited

U.S. PATENT DOCUMENTS 6,285,681 B1 * 9/2001 Kolze et al. ................... 370/442
6,285,691 B1 * 9/2001 Kaneda et al. ................. 372/33

(Continued)

FOREIGN PATENT DOCUMENTS

| WO | WO2008144003 | * 5/2008 | ............... H04N 7/12 |
| WO | WO2009051693 | * 10/2008 | ............... H04N 7/26 |
| WO | WO2009051693 |   4/2009 | |

OTHER PUBLICATIONS

Search Rept:May 26, 2011.

*Primary Examiner* — Shuwang Liu
*Assistant Examiner* — Sung Ahn
(74) *Attorney, Agent, or Firm* — Robert D. Shedd; Jerome G. Schaefer

(57) ABSTRACT

An apparatus for decoding digital data includes a processor for recreating a priori training information received with the digital data for provision to a maximum a posteriori (MAP) decoder. The processor detects locations of symbols in the input data stream and regenerates data corresponding to each location. The regenerated data is used by the processor to recreate a priori information suitable to each location of the input data stream location and provides the recreated a priori information to the MAP decoder to aid in the decoding of the digital data. In a preferred implementation, the a priori training data is structured so that after deterministic processing and trellis encoding at the transmitter, it can be regenerated by the processor as a pseudo noise (PN) sequence using a PN sequence generator.

9 Claims, 17 Drawing Sheets

(56) References Cited

U.S. PATENT DOCUMENTS

| | | | |
|---|---|---|---|
| 6,693,958 B1* | 2/2004 | Wang et al. | 375/232 |
| 2004/0260999 A1* | 12/2004 | Hattori et al. | 714/769 |
| 2005/0141629 A1* | 6/2005 | Markman | 375/265 |
| 2007/0147542 A1* | 6/2007 | Schmidt et al. | 375/298 |
| 2007/0253502 A1* | 11/2007 | Park et al. | 375/265 |
| 2009/0041166 A1* | 2/2009 | Patel et al. | 375/341 |
| 2009/0232242 A1* | 9/2009 | Xiong et al. | 375/265 |
| 2010/0195760 A1* | 8/2010 | Weiss | 375/295 |

\* cited by examiner

| S Symbol | Segment 0 | | | Segment 1 | | | Segment 2 | | | Segment 3 | | | Segment 4 | | |
|---|---|---|---|---|---|---|---|---|---|---|---|---|---|---|---|
| | Trellis | Byte | Bits | Trellis | Byte | Bits | Trellis | Byte | Bits | Trellis | Byte | Bits | Trellis | Byte | Bits |
| 0 | 0 | 0 | 7,6 | 4 | 208 | 5,4 | 8 | 412 | 3,2 | 0 | 616 | 1,0 | 4 | 828 | 7,6 |
| 1 | 1 | 1 | 7,6 | 5 | 209 | 5,4 | 9 | 413 | 3,2 | 1 | 617 | 1,0 | 5 | 829 | 7,6 |
| 2 | 2 | 2 | 7,6 | 6 | 210 | 5,4 | 10 | 414 | 3,2 | 2 | 618 | 1,0 | 6 | 830 | 7,6 |
| 3 | 3 | 3 | 7,6 | 7 | 211 | 5,4 | 11 | 415 | 3,2 | 3 | 619 | 1,0 | ... | ... | ... |
| 4 | 4 | 4 | 7,6 | 8 | 212 | 5,4 | 0 | 416 | 3,2 | 4 | 620 | 1,0 | ... | ... | ... |
| 5 | 5 | 5 | 7,6 | 9 | 213 | 5,4 | 1 | 417 | 3,2 | 5 | 621 | 1,0 | ... | ... | ... |
| 6 | 6 | 6 | 7,6 | 10 | 214 | 5,4 | 2 | 418 | 3,2 | 6 | 622 | 1,0 | ... | ... | ... |
| 7 | 7 | 7 | 7,6 | 11 | 215 | 5,4 | 3 | 419 | 3,2 | 7 | 623 | 1,0 | ... | ... | ... |
| 8 | 8 | 8 | 7,6 | 0 | 204 | 5,4 | 4 | 408 | 3,2 | 8 | 612 | 1,0 | ... | ... | ... |
| 9 | 9 | 9 | 7,6 | 1 | 205 | 5,4 | 5 | 409 | 3,2 | 9 | 613 | 1,0 | ... | ... | ... |
| 10 | 10 | 10 | 7,6 | 2 | 206 | 5,4 | 6 | 410 | 3,2 | 10 | 614 | 1,0 | ... | ... | ... |
| 11 | 11 | 11 | 7,6 | 3 | 207 | 5,4 | 7 | 411 | 3,2 | 11 | 615 | 1,0 | ... | ... | ... |
| 12 | 0 | 0 | 5,4 | 4 | 208 | 3,2 | 8 | 412 | 1,0 | 0 | 624 | 7,6 | ... | ... | ... |
| 13 | 1 | 1 | 5,4 | 5 | 209 | 3,2 | 9 | 413 | 1,0 | 1 | 625 | 7,6 | ... | ... | ... |
| ... | ... | ... | ... | ... | ... | ... | ... | ... | ... | ... | ... | ... | ... | ... | ... |
| 19 | 7 | 7 | 5,4 | 11 | 215 | 3,2 | 3 | 419 | 1,0 | 7 | 631 | 7,6 | ... | ... | ... |
| 20 | 8 | 8 | 5,4 | 0 | 204 | 3,2 | 4 | 408 | 1,0 | 8 | 632 | 7,6 | ... | ... | ... |
| 21 | 9 | 9 | 5,4 | 1 | 205 | 3,2 | 5 | 409 | 1,0 | 9 | 633 | 7,6 | ... | ... | ... |
| 22 | 10 | 10 | 5,4 | 2 | 206 | 3,2 | 6 | 410 | 1,0 | 10 | 634 | 7,6 | ... | ... | ... |
| 23 | 11 | 11 | 5,4 | 3 | 207 | 3,2 | 7 | 411 | 1,0 | 11 | 635 | 7,6 | ... | ... | ... |
| 24 | 0 | 0 | 3,2 | 4 | 208 | 1,0 | 8 | 420 | 7,6 | 0 | 624 | 5,4 | ... | ... | ... |
| 25 | 1 | 1 | 3,2 | 5 | 209 | 1,0 | 9 | 421 | 7,6 | 1 | 625 | 5,4 | ... | ... | ... |
| ... | ... | ... | ... | ... | ... | ... | ... | ... | ... | ... | ... | ... | ... | ... |
| 31 | 7 | 7 | 3,2 | 11 | 215 | 1,0 | 3 | 427 | 7,6 | ... | ... | ... | ... | ... | ... |
| 32 | 8 | 8 | 3,2 | 0 | 204 | 1,0 | 4 | 428 | 7,6 | ... | ... | ... | ... | ... | ... |
| 33 | 9 | 9 | 3,2 | 1 | 205 | 1,0 | 5 | 429 | 7,6 | ... | ... | ... | ... | ... | ... |
| 34 | 10 | 10 | 3,2 | 2 | 206 | 1,0 | 6 | 430 | 7,6 | ... | ... | ... | ... | ... | ... |
| 35 | 11 | 11 | 3,2 | 3 | 207 | 1,0 | 7 | 431 | 7,6 | ... | ... | ... | ... | ... | ... |
| 36 | 0 | 0 | 1,0 | 4 | 216 | 7,6 | 8 | 420 | 5,4 | ... | ... | ... | ... | ... | ... |
| 37 | 1 | 1 | 1,0 | 5 | 217 | 7,6 | 9 | 421 | 5,4 | ... | ... | ... | ... | ... | ... |
| ... | ... | ... | ... | ... | ... | ... | ... | ... | ... | ... | ... | ... | ... | ... | ... |
| 47 | 11 | 11 | 1,0 | 3 | 227 | 7,6 | ... | ... | ... | ... | ... | ... | ... | ... | ... |
| 48 | 0 | 12 | 7,6 | 4 | 216 | 5,4 | ... | ... | ... | ... | ... | ... | ... | ... | ... |
| 49 | 1 | 13 | 7,6 | 5 | 217 | 5,4 | ... | ... | ... | ... | ... | ... | ... | ... | ... |
| ... | ... | ... | ... | ... | ... | ... | ... | ... | ... | ... | ... | ... | ... | ... | ... |
| 95 | 11 | 23 | 1,0 | ... | ... | ... | ... | ... | ... | ... | ... | ... | ... | ... | ... |
| 96 | 0 | 24 | 7,6 | ... | ... | ... | ... | ... | ... | ... | ... | ... | ... | ... | ... |
| 97 | 1 | 25 | 7,6 | ... | ... | ... | ... | ... | ... | ... | ... | ... | ... | ... | ... |
| ... | ... | ... | ... | ... | ... | ... | ... | ... | ... | ... | ... | ... | ... | ... | ... |
| 767 | 11 | 191 | 1,0 | ... | ... | ... | ... | ... | ... | ... | ... | ... | ... | ... | ... |
| 768 | 0 | 192 | 7,6 | ... | ... | ... | ... | ... | ... | ... | ... | ... | ... | ... | ... |
| 769 | 1 | 193 | 7,6 | ... | ... | ... | ... | ... | ... | ... | ... | ... | ... | ... | ... |
| ... | ... | ... | ... | ... | ... | ... | ... | ... | ... | ... | ... | ... | ... | ... | ... |
| 815 | 11 | 203 | 1,0 | 3 | 419 | 7,6 | 7 | 623 | 5,4 | 11 | 827 | 3,2 | ... | ... | ... |
| 816 | 0 | 204 | 7,6 | 4 | 408 | 5,4 | 8 | 612 | 3,2 | 0 | 816 | 1,0 | ... | ... | ... |
| 817 | 1 | 205 | 7,6 | 5 | 409 | 5,4 | 9 | 613 | 3,2 | 1 | 817 | 1,0 | ... | ... | ... |
| ... | ... | ... | ... | ... | ... | ... | ... | ... | ... | ... | ... | ... | ... | ... | ... |
| 827 | 11 | 215 | 7,6 | 3 | 419 | 5,4 | 7 | 623 | 3,2 | 11 | 827 | 1,0 | ... | ... | ... |

*FIG. 16*

PRIORI TRAINING IN A MOBILE DTV SYSTEM

This application claims the benefit, under 35 U.S.C. §365 of International Application PCT/US2010/001828, filed Jun. 25, 2010, which was published in accordance with PCT Article 21(2) on Dec. 29, 2011 in English.

FIELD OF INVENTION

The present invention generally relates to data communications systems, and more particularly to a priori training data and processing for a trellis encoded digital television signal.

BACKGROUND

The Advanced Television Systems Committee (ATSC) standard for Digital Television (DTV) in the United States requires an 8-VSB (Vestigial Sideband Modulation) transmission system which includes Forward Error Correction (FEC) as a means of improving system performance. (United States Advanced Television Systems Committee, "ATSC Digital Television Standard", document A53.doc, Sep. 16, 1995.) FIG. 1 shows a block diagram of a legacy ATSC DTV system comprising transmitter 10 and receiver 20. As shown in FIG. 1, legacy ATSC transmitter 10 includes a data randomizer 111 followed by FEC encoding subsystem 110 having a Reed-Solomon error correction encoder 112, followed by interleaver 114, and trellis encoder 116. The output of FEC encoding subsystem 110 is provided to 8-VSB modulator 119. Legacy ATSC receiver 20 includes 8-VSB demodulator 129 followed by FEC decoding subsystem 120, including trellis decoder 126, byte de-interleaver 124, and Reed-Solomon error correction decoder 122. The output of FEC decoding subsystem 120 is provided to data de-randomizer 121 for re-creation of the input data originally provided to data randomizer 111. The operation of the system of FIG. 1 is described in greater detail in the aforementioned ATSC standard. See also International Patent Application Publication No. WO 2008/144004.

The ATSC DTV transmission scheme is not robust enough against Doppler shift and multipath radio interference, and is designed for highly directional fixed antennas, hindering the provision of expanded services to customers utilizing mobile and handheld (M/H) devices. To overcome these issues, and create a more robust and more flexible system, among other things, it is possible to add a new layer of FEC coding, and more powerful decoding algorithms to decrease the Threshold of Visibility (TOV). The added layer of FEC coding may require decoding techniques such as iterative (turbo) decoding (see, e.g., C. Berrou et al., "Near Shannon Limit Error—Correcting Coding and Decoding: Turbo-Codes (1)", Proceedings of the IEEE International Conference on Communications—ICC'93, May 23-26, 1993, Geneva, Switzerland, pp. 1064-1070; and M. R. Soleymani et al., "Turbo Coding for Satellite and Wireless Communications", Kluwer Academic Publishers, USA, 2002) and trellis decoding algorithms like the MAP decoder described by L. R. Bahl, J. Cocke, F. Jelinek and J. Raviv, "Optimal Decoding of Linear Codes for Minimizing Symbol Error Rate", IEEE Transactions on Information Theory, Vol. IT-20, No. 2, March 1974, pp. 284-287.

In addition, it is possible to include additional training data, also called a priori or preamble data, in the digital data stream to aid the receiver. However, in order to be backward compatible with the original ATSC DTV standard, the additional training data must be introduced prior to data randomizer 101 of legacy ATSC transmitter 10 in FIG. 1. Hence, the training data will be fully encoded by the legacy ATSC transmitter 10. This implies that at the receiver, the data stream must first be decoded with the legacy ATSC receiver to retrieve the additional training data, and then further utilize it to aid the mobile reception.

SUMMARY

In an exemplary embodiment in accordance with the principles of the invention, preamble training data conveying a priori tracking information for iterative forward error correction (FEC) decoding at a receiver is included in a data field of a data burst that is transmitted to the receiver. At the transmitter, the preamble training data is inserted into the data stream to be transmitted which is then encoded by a digital encoder processor that includes a plurality of deterministic digital processing units followed by a trellis encoder. At the receiver, as the data steam is being received, an a priori processor provides a priori metric information concerning the preamble training data to the iterative FEC decoding apparatus of the receiver without feedback from the FEC decoding apparatus. As such, the a priori processor effectively re-creates the preamble training data at the receiver without having to wait for the preamble training data to be FEC decoded.

In a further exemplary embodiment, the preamble training data as inserted into the data stream at the transmitter is so constituted so that it can be readily re-created at the receiver using a pseudo noise (PN) sequence generator. This makes it possible to reduce or eliminate the storage of preamble training data at the receiver.

In view of the above, and as will be apparent from reading the detailed description, other embodiments and features are also possible and fall within the principles of the invention.

BRIEF DESCRIPTION OF THE FIGURES

Some embodiments of apparatus and/or methods in accordance with embodiments of the present invention are now described, by way of example only, and with reference to the accompanying figures in which:

FIG. 16 shows the relationship between the ordered ATSC trellis decoder output symbols and the corresponding input bytes and dual-bits of each of the twelve constituent trellis encoders of the trellis encoder of FIG. 14.

DESCRIPTION OF EMBODIMENTS

Figure 2:
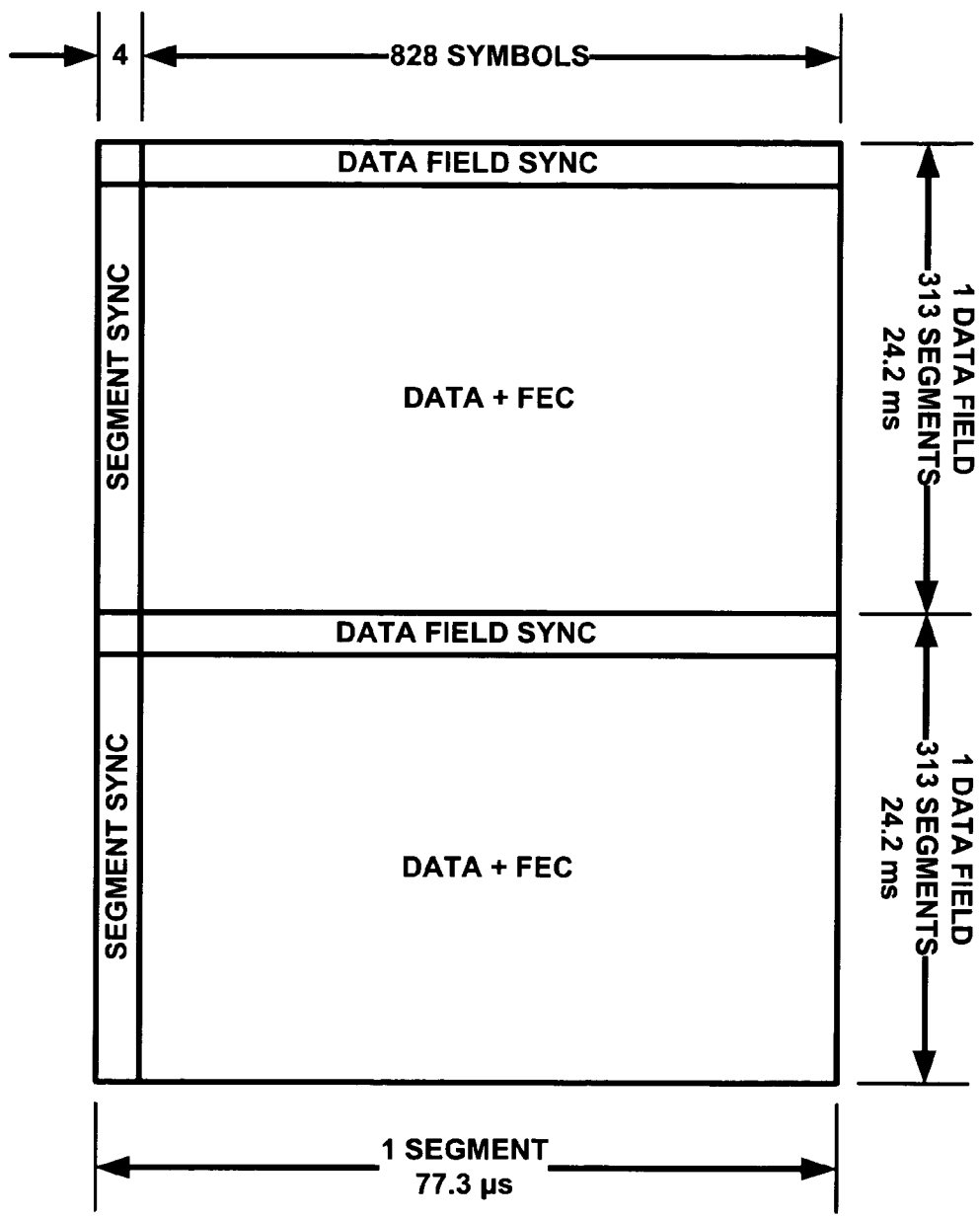
FIG. 2 illustrates the format of an ATSC-DTV data frame.

FIG. 2 shows the format of an ATSC-DTV data frame as transmitted. Each data frame consists of two data fields, each containing 313 data segments. The first data segment of each data field is a unique synchronizing segment (Data Field Sync) shown in greater detail in FIG. 3 and further discussed below. The remaining 312 data segments of each data field each carries the equivalent data of one 188-byte MPEG-compatible transport packet and its associated FEC overhead.

Figure 3:
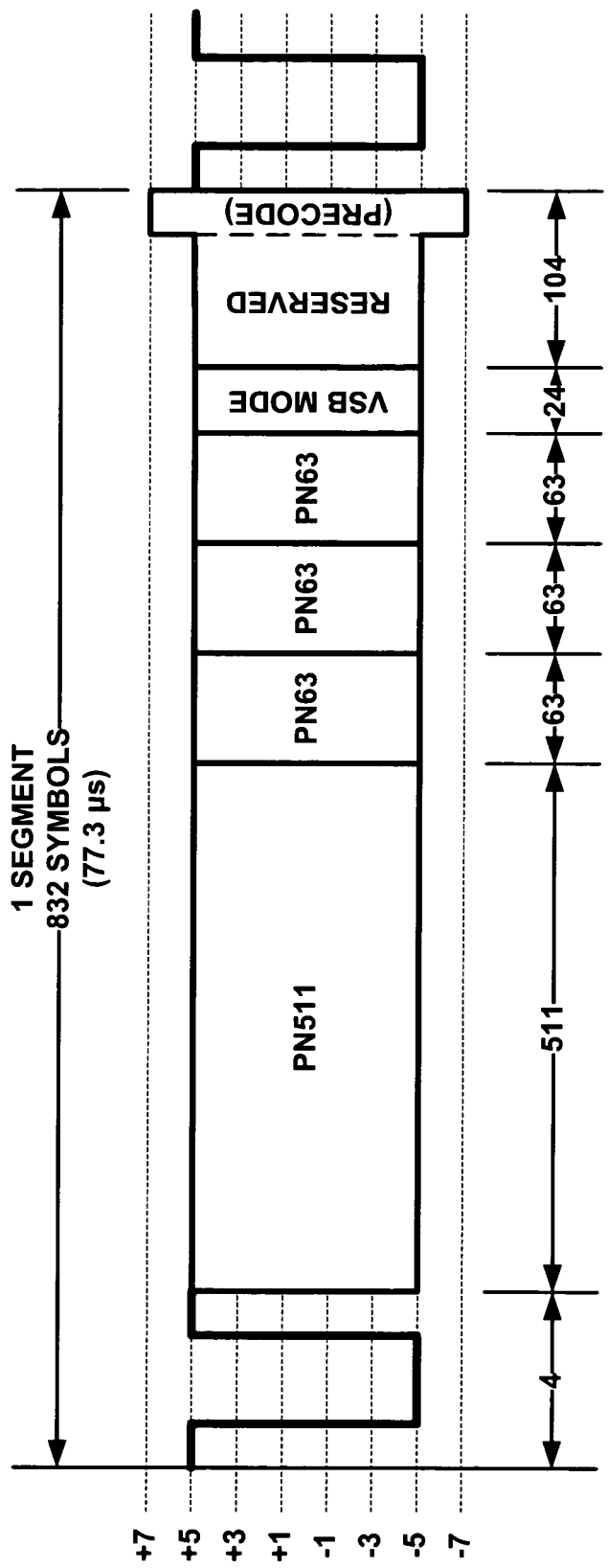
FIG. 3 illustrates the format of a Data Field Sync segment in an ATSC-DTV data frame.

Each data segment consists of 832 8-VSB symbols. The first four symbols of each data segment, including the Data Field Sync segments, form a binary pattern and provide segment synchronization. As shown in FIG. 3, the first four 8-VSB symbols of each data segment have values of +5, −5, −5, and +5. This four-symbol data segment sync signal also represents the sync byte of each 188-byte MPEG-compatible transport packet conveyed by each of the 312 data segments in each data field. The remaining 828 symbols of each data segment carry data equivalent to the remaining 187 bytes of a transport packet and its associated FEC overhead.

FIG. 3 shows a Data Field Sync segment in greater detail. As shown in FIG. 3, each Data Field Sync segment includes several pseudo random (PN) sequences, a VSB mode field and a reserved field of 104 symbols. (Note that the last 12 symbols of the reserved field, labeled PRECODE, are used in trellis coded terrestrial 8-VSB to replicate the last 12 symbols of the previous segment.)

Figure 4:
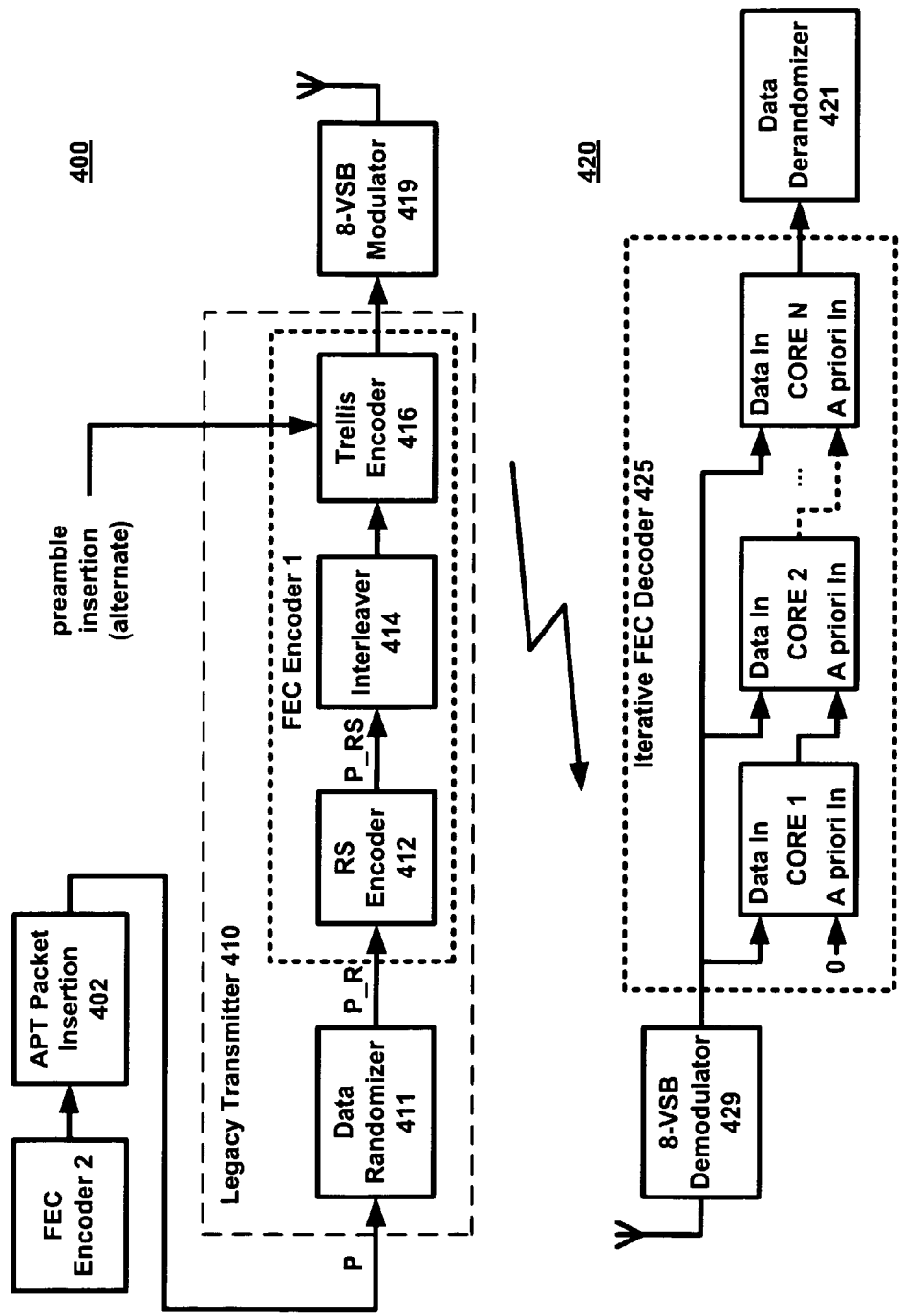
FIG. 4 is a block diagram of an exemplary DTV M/H System in accordance with the principles of the current invention.

FIG. 4 shows a block diagram of an exemplary transmitter 400 and receiver 420 for a mobile/handheld (M/H) DTV system, hereby called DTV-M/H. In the exemplary embodiment shown, transmitter 400 comprises legacy transmitter 410 which is compliant with the ATSC DTV standard, like the transmitter 10 of FIG. 1. In addition to FEC Encoder 1, transmitter 400 introduces an added layer of FEC, exemplified by FEC Encoder 2. At receiver 420, Iterative FEC Decoder 425 performs decoding of the FEC encoding placed onto the transmitted signal via the various FEC encoders of the transmitter. Although a detailed explanation of Iterative FEC Decoder 425 is not necessary for this disclosure, one skilled in the art will understand that Iterative FEC decoder 425 may include maximum a posteriori (MAP) decoding, including ATSC trellis decoding, and FEC decoding of the added FEC encoding of FEC Encoder 2, which will iteratively interact, each decoder sending extrinsic information to the other. Such systems are described in C. Berrou, A. Glavieux and P. Thitimajshima, "Near Shannon Limit Error—Correcting Coding and Decoding: Turbo-Codes (1)", Proceedings of the IEEE International Conference on Communications—ICC'93, May 23-26, 1993, Geneva, Switzerland, pp. 1064-1070, M. R. Soleymani, Y. Gao and U. Vilaipornsawai, "Turbo Coding for Satellite and Wireless Communications", Kluwer Academic Publishers, USA, 2002, and previously mentioned L. R. Bahl, J. Cocke, F. Jelinek and J. Raviv, "Optimal Decoding of Linear Codes for Minimizing Symbol Error Rate". In addition, Iterative FEC Decoder 425 will perform the number of iterations deemed necessary to achieve a desired system performance.

In an exemplary mobile DTV system according to FIG. 4, preamble training data segments, also called a priori tracking (APT) packets, may be transmitted in addition to the synchronization data present in the ATSC-DTV data frame described above. This preamble training data, however, is fully encoded by all levels of legacy ATSC FEC coding in the system (FEC encoder 1), as well as being byte interleaved and randomized. The preamble training data is known data which in an exemplary embodiment is added to the transmit data stream via APT packet insertion block 402. In a further exemplary embodiment, the preamble training data may be inserted inside trellis encoder 416.

An example of a burst repetitive data structure for transmission of the DTV-M/H data is given in TABLE 1. Observe that the preamble data segments are equivalent to a packet code block of 52 packets or segments.

TABLE 1

| DTV-M/H Data Structure | |
| --- | --- |
| Data Field F0 | ATSC Field Sync |
|  | 260 Legacy ATSC Data Segments |
|  | 52 Preamble Data Segments |
| Data Field F1 | ATSC Field Sync |
|  | 52 DTV-M/H Data Segments |
|  | 26 Legacy ATSC Data Segments |
|  | 104 DTV-M/H Data Segments |
|  | 130 Legacy ATSC Data Segments |
| Data Field F2 | ATSC Field Sync |
|  | 312 Legacy ATSC Data Segments |

As shown in TABLE 1, a data burst comprising three data fields, F0, F1 and F2, is repetitively transmitted, each corresponding to 1.5 frame of the legacy ATSC-DTV standard. The aforementioned preamble training data is placed in the first data field F0 as 52 data segments. One skilled in the art will appreciate that the number of preamble segments can be other than 52.

When receiving a data burst such as set forth in TABLE 1, a DTV-M/H receiver will discard the 260 Legacy ATSC data segments in Data Field F0 and process the remaining data including the 52 preamble data segments. The preamble data is to be utilized by the DTV-M/H receiver as training data used in order to enhance receiver performance.

Figure 1:
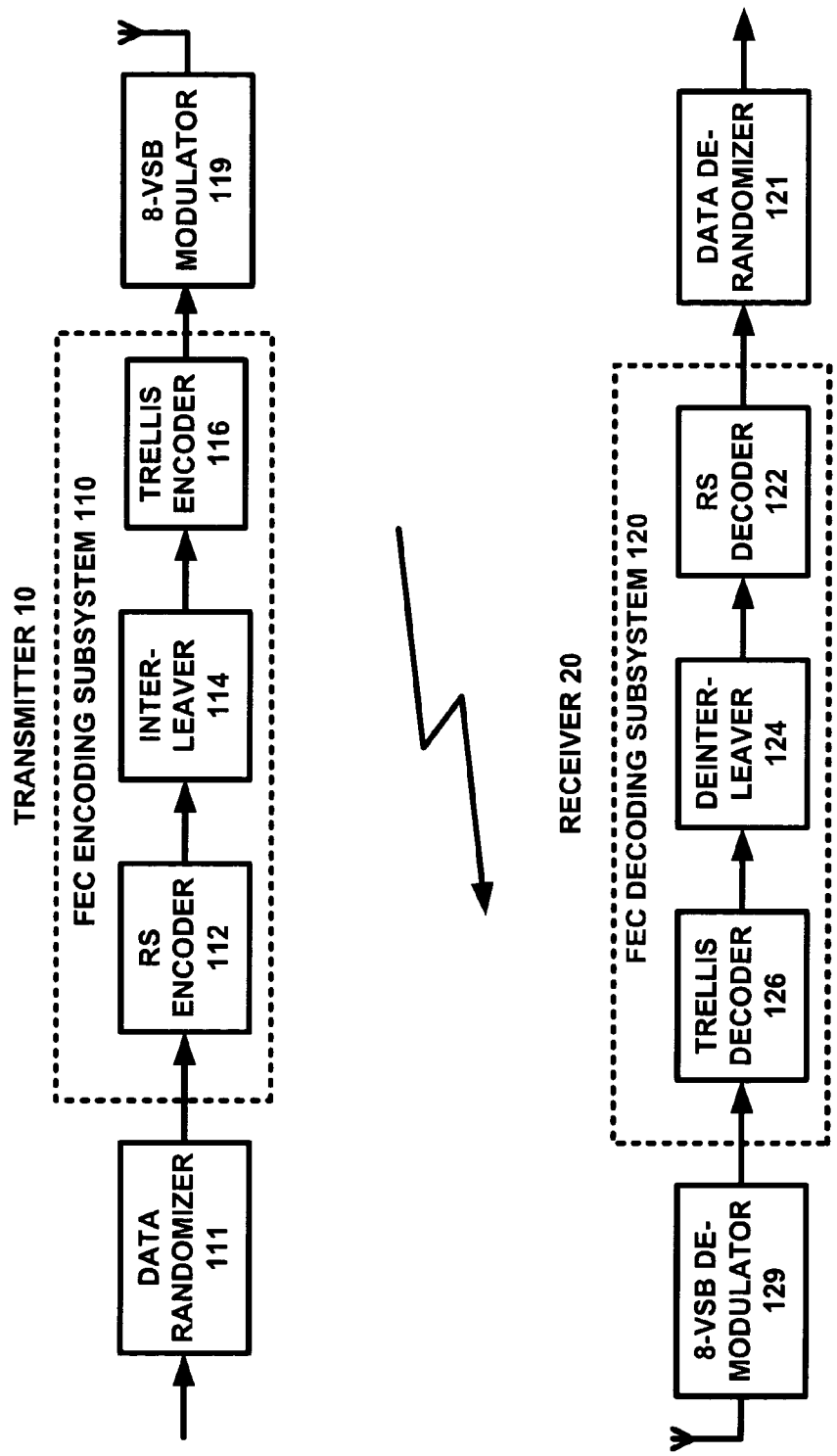
FIG. 1 is a block diagram of a digital television (DTV) system in accordance with the Advanced Television Systems Committee (ATSC) standard for DTV.

As described above, the FEC Encoder 1 of FIG. 4 includes a Reed Solomon (RS) encoder 412, interleaver 414, and trellis encoder 416, similar to the blocks of the FEC Encoding Subsystem 110 of the legacy transmitter of FIG. 1. One skilled in the art will appreciate that the operations of data randomization, RS encoding and interleaving are deterministic and, although they will modify the preamble training data, the deterministic nature of the preamble training data will be preserved at the output of these three functional blocks. However, the trellis encoding operation (116, 416), which operates on each dual-bit of a byte, is not deterministic, since it is a function of the trellis state, which in turn is a function of the data stream preceding the preamble. Hence, at the transmitter output, one cannot easily identify the presence of the preamble in the data stream.

In an exemplary embodiment, for a preamble P of 52 packets of 187 bytes each, the output of data randomizer 411 in the legacy transmitter 410 of FIG. 4 is a modified preamble, designated P_R. Modified preamble P_R contains 52 packets of 187 bytes each, with each byte being a randomized version of the corresponding byte in preamble P, according to the randomization carried out by data randomizer 411 and the position of the preamble P in the data field.

In the exemplary embodiment, RS encoder 412 implements an RS code with a rate of 187/207. RS encoder 412 outputs a modified preamble, designated P_RS, containing 52 packets of 207 bytes each, where the first 187 bytes of each packet of P_RS are the same as in P_R and the last 20 bytes of each packet of P_RS are the RS encoder parity bytes associated with each packet of P_R. (See FIG. 12.) Since the RS parity bytes also have fixed values, the presence of RS encoder 412 extends the number of preamble bytes by the RS code rate 187/207. The RS parity bytes are also considered preamble bytes for the purpose of using them as training bytes at the receiver. In an ATSC-compliant embodiment, interleaver 414 is a convolutional interleaver, in which case the modified preamble P_RS (of 52 consecutive RS encoded packets of 207 bytes each) at the input of interleaver 414 will be spread over 104 output packets in a byte-interleaved order of bytes.

Figure 5:
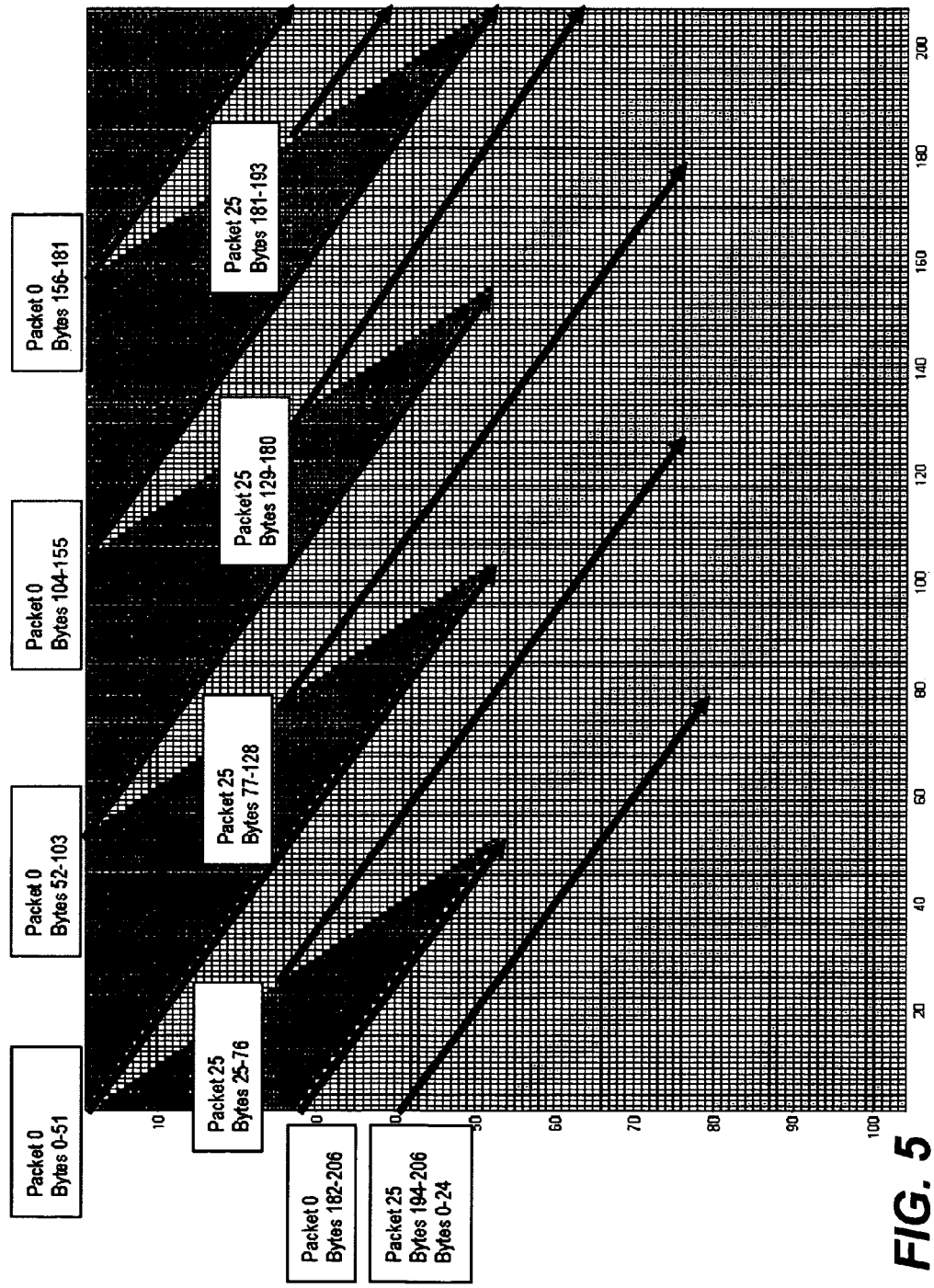
FIG. 5 shows a plot of the ATSC byte interleaver output (horizontal axis, left to right) versus time (vertical axis, top to bottom) for a block of 52 input packets.

FIG. 5 shows a plot of the interleaver 414 output bytes on the horizontal axis, from left to right versus the number of packets in time on the vertical axis, from top to bottom, for a block of 52 preamble packets at the input of interleaver 414. The horizontal axis shows the number of output bytes per packet, for a total of 207 bytes. The vertical axis shows the number of each output packet in time, for a total of 104. The black arrows identify the input packet 0 and the input packet 25, as examples of where these packets end up appearing in the output stream. In FIG. 5, the white squares are associated with all 52 preamble packets, identifying the positions where they will be present in the output stream. The remaining squares (dark-gray or light gray) are bytes belonging to other blocks of packets before and after the preamble which become byte interleaved with the preamble.

One may observe that there is a one-to-one fixed mapping between each preamble input byte and a corresponding byte in the white squares of FIG. 5. For example, byte 1 of packet 0 at the input of interleaver 414 will appear as the second byte of the second packet at the output of interleaver 414. Also, the 182$^{nd}$ byte of the first packet at the input of interleaver 414 will appear as the 207$^{th}$ byte of the 26$^{th}$ packet at the output of interleaver 414. Hence, per FIG. 5, it is possible to identify with certainty the position and value of each preamble training data byte at the output of interleaver 414 in the FEC Encoder 1 block of legacy transmitter 410.

As described below in greater detail with reference to FIG. 14, in accordance with the ATSC standard, an illustrative implementation of trellis encoder 416 comprises twelve byte-interleaved trellis encoders of code rate 2/3, whereby each encoder sequentially receives one byte at a time and generates one symbol at a time. Each input byte to trellis encoder 416 is split into four dual-bits (FIG. 11), and each dual-bit is trellis encoded to form a symbol of three bits. Two of the three bits are information bits associated with the dual-bit at its input and the third bit is an encoded bit which is a function of the trellis state and previous inputs.

One may observe that the 3-bit, 8-level symbols at the output of trellis encoder 416 associated with preamble input bytes are not fixed, since they are a function of the trellis state, which is a function of the preceding input stream containing byte-interleaved preamble and other data bytes. However, for each 8-level symbol at the output of trellis encoder 416 associated with a preamble byte, its embedded 2-bit information symbol is fixed and known at its input, and its position in the stream may also be mapped. For example, in the data block shown in FIG. 5, there will be twelve consecutive preamble bytes consecutively entering the twelve constituent encoders of trellis encoder 416, such that the first dual-bit of the first byte will create the first output preamble symbol; the first dual-bit of the second byte will create the second output preamble symbol; and the second dual-bit of the first byte will create the thirteenth output preamble symbol. By inputting the entire data block of FIG. 5 into trellis encoder 416, the mapping of all of the preamble related symbols at the output of trellis encoder 416 may be established with certainty, as well as the two fixed information bits, or dual-bits that each symbol contains.

One skilled in the art will appreciate that APT packet insertion block 402 can alternately be placed before FEC Encoder 2, without loss of generality, provided that FEC Encoder 2 is composed of deterministic processing blocks such as FEC block codes (as opposed to FEC trellis or convolutional codes, which are state-machines), interleavers, randomizers, etc., thereby allowing the preamble training data to be inserted prior to the FEC Encoder 2 block and still be traced within the encoded data as discussed above.

Figure 6:
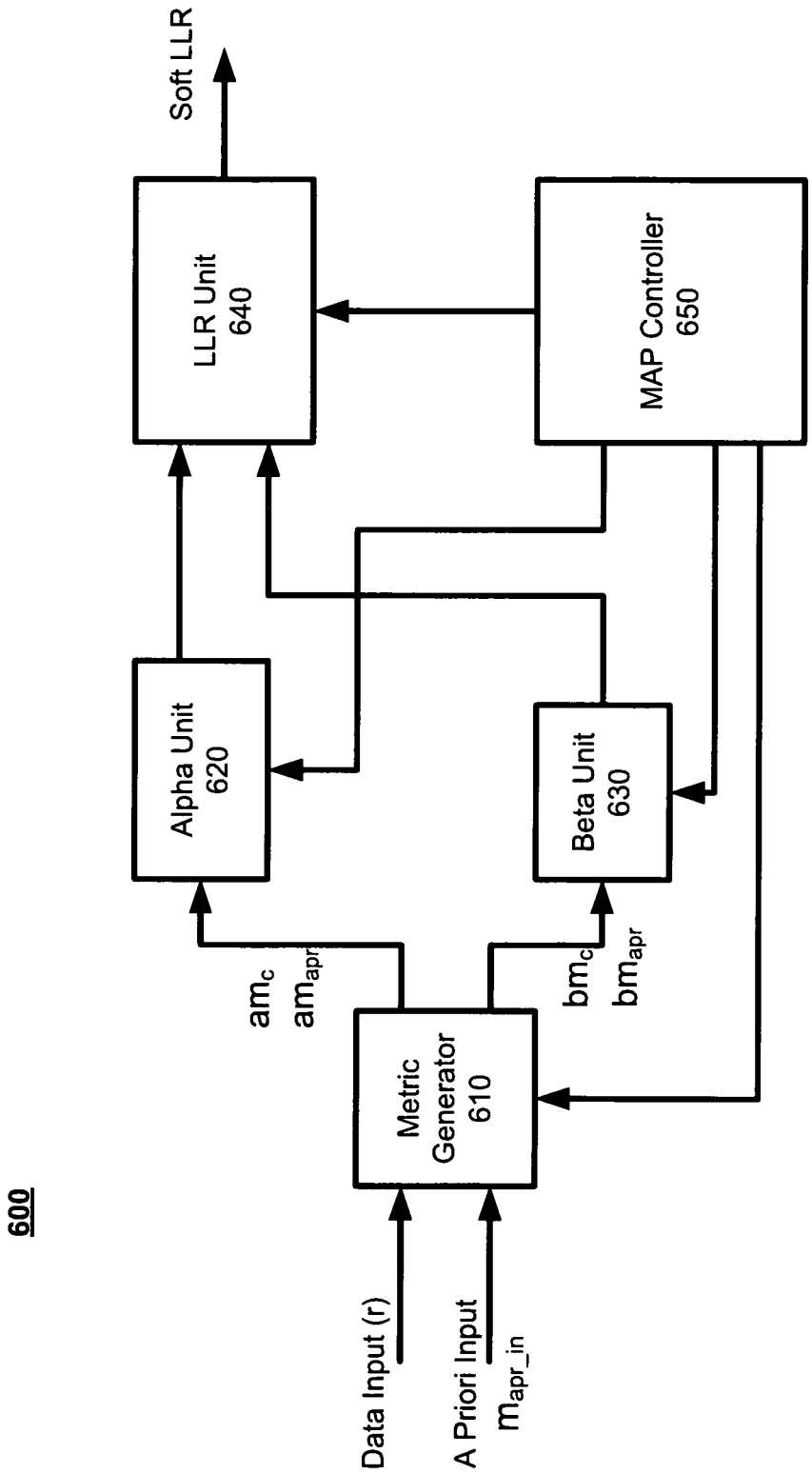
FIG. 6 illustrates a maximum a posteriori (MAP) decoder architecture.

Referring again to FIG. 4, in an exemplary embodiment, Iterative FEC decoder 425 of the receiver 420 comprises a chain of FEC cores (1, 2, . . . , N) which operate in a known manner to decode demodulated signals from demodulator 429. A more detailed description of a suitable implementation can be found in PCT Application No. PCT/US09/06373 entitled "Diversity Architecture for a Mobile DTV System" filed on Dec. 3, 2009. Each FEC core comprises a MAP decoder, an illustrative implementation of which is shown in FIG. 6. Each FEC core of iterative decoder 425 provides a priori metrics to the next iteration core, so that data gathered on one iteration serves as prior knowledge for the next iteration.

MAP decoder 600 shown in FIG. 6 includes metric generator unit 610 which determines channel metrics $m_c$ for each 8-VSB input symbol r from demodulator 429, in accordance with the following expression:

$$m_C(k,i)=\|(r_k-c_i)\|^2/(2\sigma^2) \qquad (1)$$

where k≥1 is the symbol period; $\sigma^2$ is the noise variance; and $c_i$, for i=0, 1 . . . 7, are the eight possible trellis coded modulation (TCM) symbols. The channel metrics $m_c(k, i)$ are then stored in a memory of size $2*L_{pm}$, before they are retrieved to be processed by the following units of the MAP decoder. The value $L_{pm}$, hereby called path memory block, is equivalent to the traceback latency of a Viterbi decoder.

Metric generator unit 610 also stores a priori metrics $m_{apr}$ received from a previous iteration core of the iterative FEC decoder 425 for a duration equivalent to the size of two path memory blocks, before they are retrieved to be processed by the following MAP decoder units. The a priori metrics $m_{apr}$ for each symbol are given by:

$$m_{apr}(k,j)=-\log(P(I_k=j)) \qquad (2)$$

where k≥1 is the symbol period; $I_k$ is the bit-pair at symbol period k; j represents the four possible bit-pair values, 0, 1, 2, 3; log(.) is the logarithm function; and $P(I_k=j)$ is the probability that $I_k$ has the value j. Note that although the present embodiment is described in terms of bit-pairs or dual-bits, in which each bit-pair has four possible values, groupings of different numbers of bits b are also possible, whereby $0 \le j < 2^b$.

The metric generator 610 sends the stored metric values $m_c$ and $m_{apr}$ to forward metric (alpha) unit 620 and backward metric (beta) unit 630. The alpha values $am_c$ and $am_{apr}$ are sent in a first-in-first-out (FIFO) order, while the beta $bm_c$ and $bm_{apr}$ values are sent in a last-in-first-out (LIFO) order. In addition, the metric generator 610 receives a priori information from a previous iteration core of FEC decoder 425 and sends the stored values to the alpha 620 and beta 630 units in a similar fashion.

Log likelihood ratio (LLR) unit 640 takes the corresponding forward and backward metrics from alpha and beta units 620 and 630, respectively, and uses the metrics to generate a soft decision version of each symbol bit-pair, which can also be interpreted as a metric to be processed by the following core in Iterative FEC Decoder 425.

MAP controller unit 650 directs the operations of metric generator 610, alpha unit 620, beta unit 630, and LLR unit 640.

Figure 7:
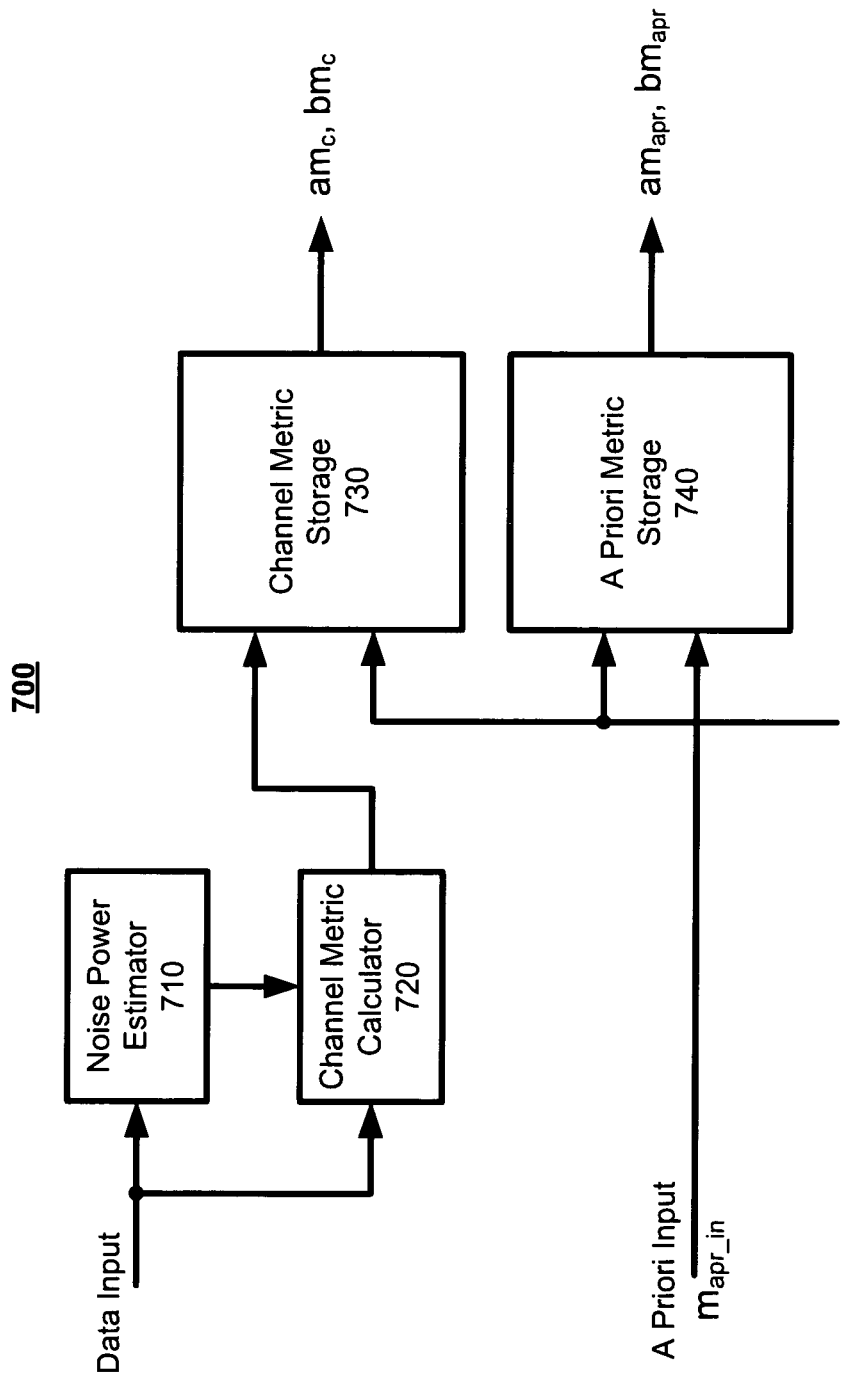
FIG. 7 is a block diagram of an exemplary embodiment of a metric generator of the MAP decoder of FIG. 6.

FIG. 7 is a block diagram of an illustrative implementation 700 of metric generator 610. Metric generator 700 of FIG. 7 includes noise power estimator 710, channel metric calculator 720, channel metric storage 730 and a priori metric storage 740. Storage 730, 740 can be implemented using one or more RAM devices, for example. The noise power estimator 710 estimates, such as by using quantizers, the amount of noise in the input symbols and averages the noise to obtain an estimate of the power or variance $\sigma^2$. The channel metric calculator 720 performs the calculation in Eq. 1. Storage 730 and 740 store the channel and a priori metric values, respectively, for later retrieval.

As mentioned above, in the system of FIG. 4, the preamble training data is fully FEC encoded by FEC Encoder 1. Because the preamble training data extends for entire segments or packets, however, the operations of encoding, randomizing, and RS encoding are deterministic. In addition, because the placement of the preamble training data is constant within a field structure, as shown in TABLE 1, the operation of byte interleaving is also deterministic. Processing of the preamble data through the encoding chain, as in the transmitter of FIG. 1 or 4, results in bytes of each segment being randomized, RS encoded to create more parity bytes, and then interleaved. The interleaving operation (114, 414), which in accordance with ATSC is convolutional, spreads the block of 52 preamble packets over 104 packets, as shown in FIG. 5. Other examples of data structures would also result in a similar spreading of the data. In addition, the dual-bits of each byte will be processed by the trellis encoder (116, 416) resulting in 8-VSB modulated symbols. Thus, at the receiver, each 8-VSB modulated symbol associated with a preamble dual-bit will have a particular deterministic position within the field structure. This permits the placement of an a priori processor as described below, just prior to or as part of the metric generator 610 and before FEC decoding, as the metric generator 610 is the first block in the FEC decoding chain of a MAP decoder.

Figure 8:
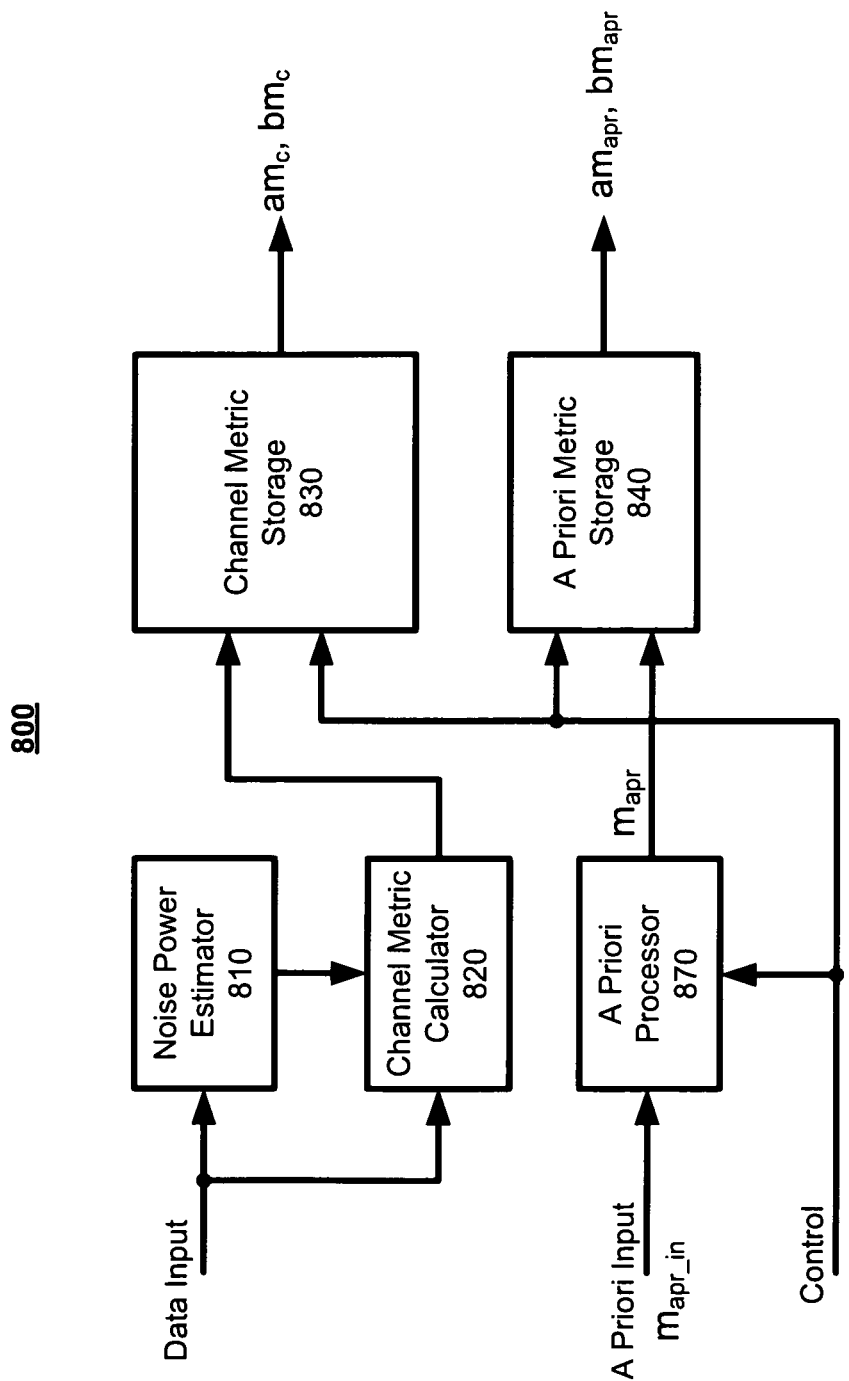
FIG. 8 is a block diagram of a further exemplary embodiment of a metric generator including an a priori processor.

FIG. 8 is a block diagram of a further illustrative implementation 800 of metric generator 610 including an a priori processor 870. As described in greater detail below, prior to MAP decoding, a priori processor 870 takes advantage of the preamble training data in order to influence the iteration chain of FEC decoding from the very first MAP decoder in the chain, improving the chain's performance. This is in contrast to waiting to FEC decode the first system iteration before accessing the preamble training data and generating a priori information associated with this data for the following FEC iteration. Since trellis decoders are prone to generating burst errors, it is desirable to use the preamble training data as early in the iterative FEC decoding chain as possible.

Figure 9:
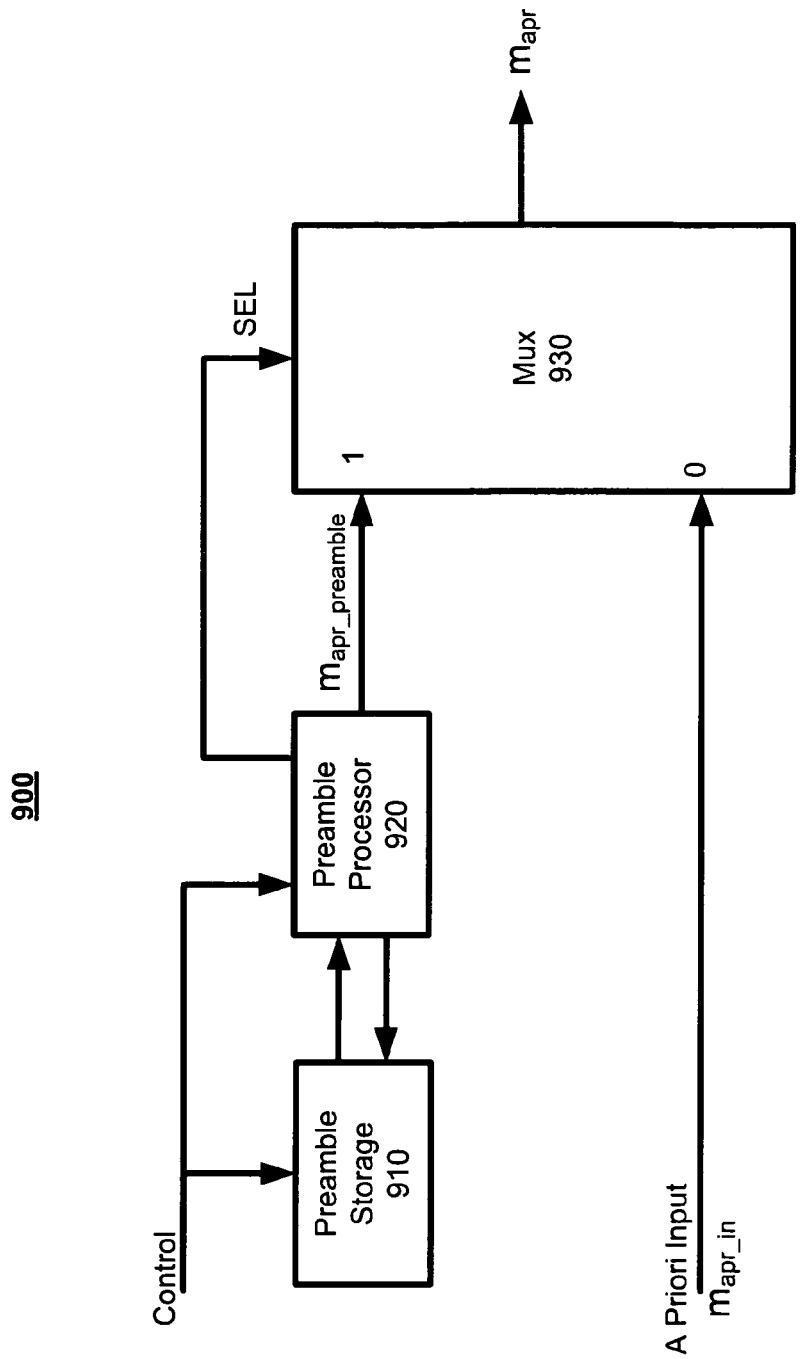
FIG. 9 is a block diagram of an exemplary embodiment of an a priori processor in accordance with the principles of the current invention.

FIG. 9 shows an illustrative implementation 900 of a priori processor 870 in the metric generator of FIG. 8. A priori processor 900 includes preamble storage 910, preamble processor 920, and multiplexer (mux) 930. For each trellis-encoded 8-VSB symbol of the preamble, preamble storage 910 contains two sets of information: the preamble dual-bit value VAL associated with the symbol; and the position of the symbol LOC in the field structure of TABLE 1 after the byte interleaving and trellis encoding operations. The preamble dual-bit values VAL stored in 910 are for the randomized version of the original preamble information and preamble parity. Preamble storage 910 can be implemented with a Read-Only Memory (ROM), for example.

In a priori processor 900 of FIG. 9, control inputs (from MAP controller 650) direct preamble processor 920 to read the contents of preamble storage 910. Preamble processor 920 utilizes the preamble storage information to identify a preamble symbol and generates signal SEL which is '1' when a preamble symbol is present and '0' otherwise. Preamble processor 920 also generates preamble a priori metrics $m_{apr\_preamble}$ which are provided to mux 930. Preamble a priori metrics $m_{apr\_preamble}$ are generated, as described in greater detail below, to provide an unambiguous indication of the correct value of the corresponding preamble symbol. In accordance with the value of SEL, mux 930 provides to a priori metric storage 840, either preamble a priori metrics $m_{apr\_preamble}$ from preamble processor 920, or the a priori metrics $m_{apr\_in}$ received from the previous iteration core of iterative FEC decoder 425. Note that for the first metric generator in the iterative FEC chain, input a priori metric $m_{apr\_in}$ is set to 0. Preamble processor 920 may be implemented, for example, as a state machine or as a processor unit executing program instructions.

In an exemplary embodiment, preamble a priori training data which simplifies the receiver design, particularly the implementation of a priori processor 870, is used. Preferably, the preamble a priori training data used will allow preamble storage (910) to be smaller. Because such storage is present in every iteration core of FEC decoder 425, and there are typically at least seven iterations, a reduction in storage size represents substantial hardware savings, considering that the size of the a priori training data is 52 segments and that preamble storage 910 stores the value of every dual-bit (VAL) as well as its location (LOC) within the field structure of TABLE 1.

In an exemplary embodiment, as shown in FIG. 4, the preamble a priori training data is inserted before ATSC Legacy transmitter 410. In this embodiment, the preamble a priori training data is a sequence that has been generated so that after passing this sequence of a priori training data through the ATSC legacy transmitter 410, the a priori processor (870) in each MAP decoder (600) of iterative FEC decoder 425 of the receiver sees an ordered PN sequence in all of the preamble dual-bits that do not originate from RS parity bytes. Advantageously, by thus ensuring that this sequence is seen as a PN sequence at the a priori processor (870), it can be re-generated at the a priori processor by a PN generator as opposed to having to store the entire sequence (as in 910). One skilled in the art will appreciate that a PN generator may be implemented, for example, with a simple shift register (for example, a 31-bit register for a PN of order 31) and exclusive-or gates. An exemplary embodiment of such an a priori processor is described below in greater detail.

An illustrative procedure for creating such a sequence of a priori training data will now be described with reference to FIGS. 10-16. The basic approach of this procedure entails starting with the desired PN sequence at the a priori processor (870) and working backwards to the input of legacy transmitter 410, performing the inverses of the operations associated with the ATSC trellis encoding (416), convolutional byte interleaving (414), and randomizing (411) to create the original preamble data to be inserted before legacy ATSC transmitter 410.

Figure 10:
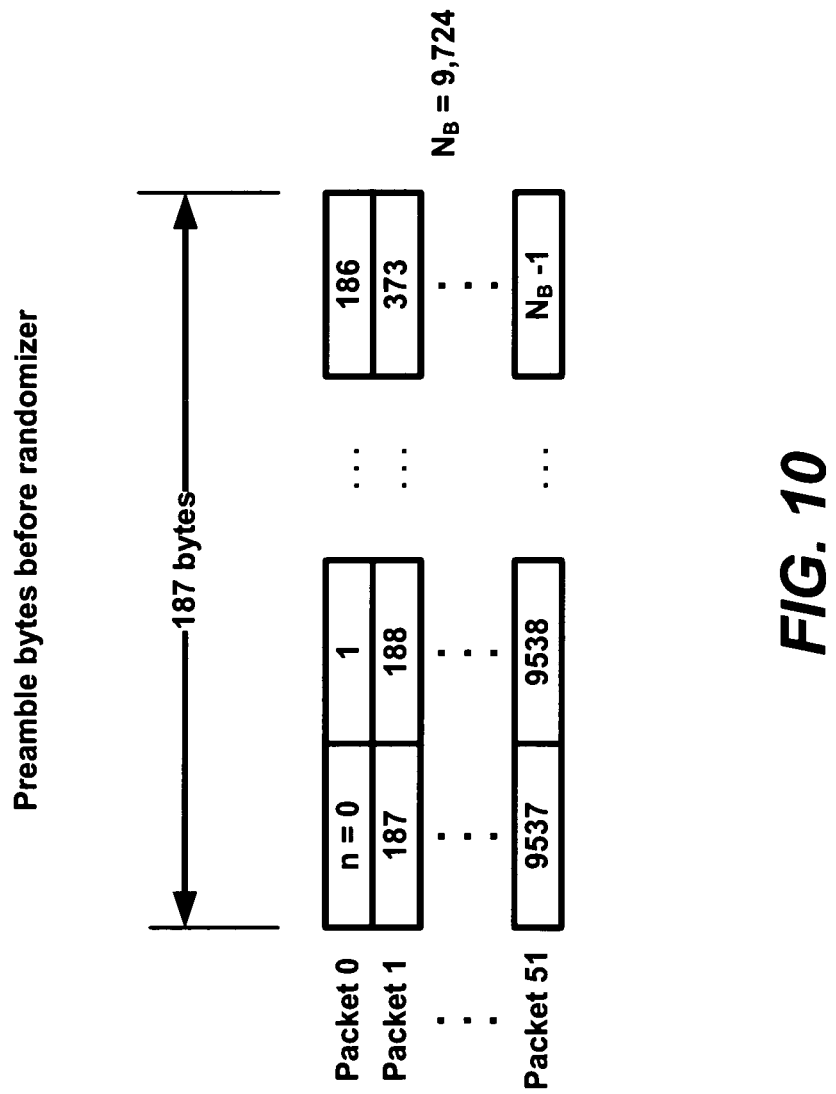
FIG. 10 shows the numbering of preamble bytes at the input to the data randomizer of a legacy ATSC transmitter.

FIG. 10 shows the bytes of the 52 preamble segments (or packets) of TABLE 1 numbered at the input to data randomizer 411 of legacy transmitter 410 for a total of number of bytes of $N_B=52*187=9,724$ with byte numbers n, $0 \leq n \leq N_B-1$. Because data randomizer 411 only changes the value of each byte, the same byte order shown in FIG. 10 remains at its output.

Figure 11:
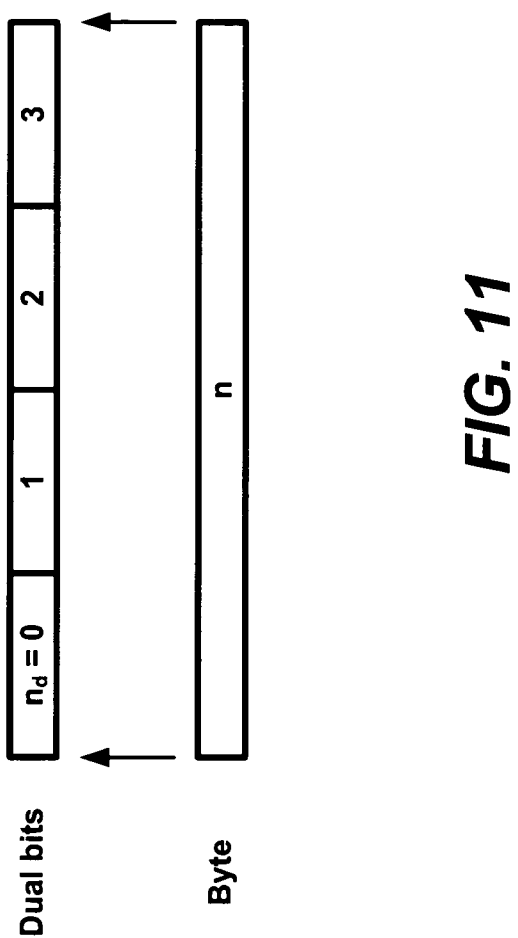
FIG. 11 shows the four dual-bits of a byte.

FIG. 11 shows that each byte n is composed of four dual-bits numbered $n_d$, where $0 \leq n_d \leq 3$. Hence, each preamble dual-bit location may be identified by the pair $(n, n_d)$. For example, preamble dual-bit location ($n=188$, $n_d=2$) is the dual-bit number 2 of the byte number 188, according to FIGS. 10 and 11.

Figure 12:
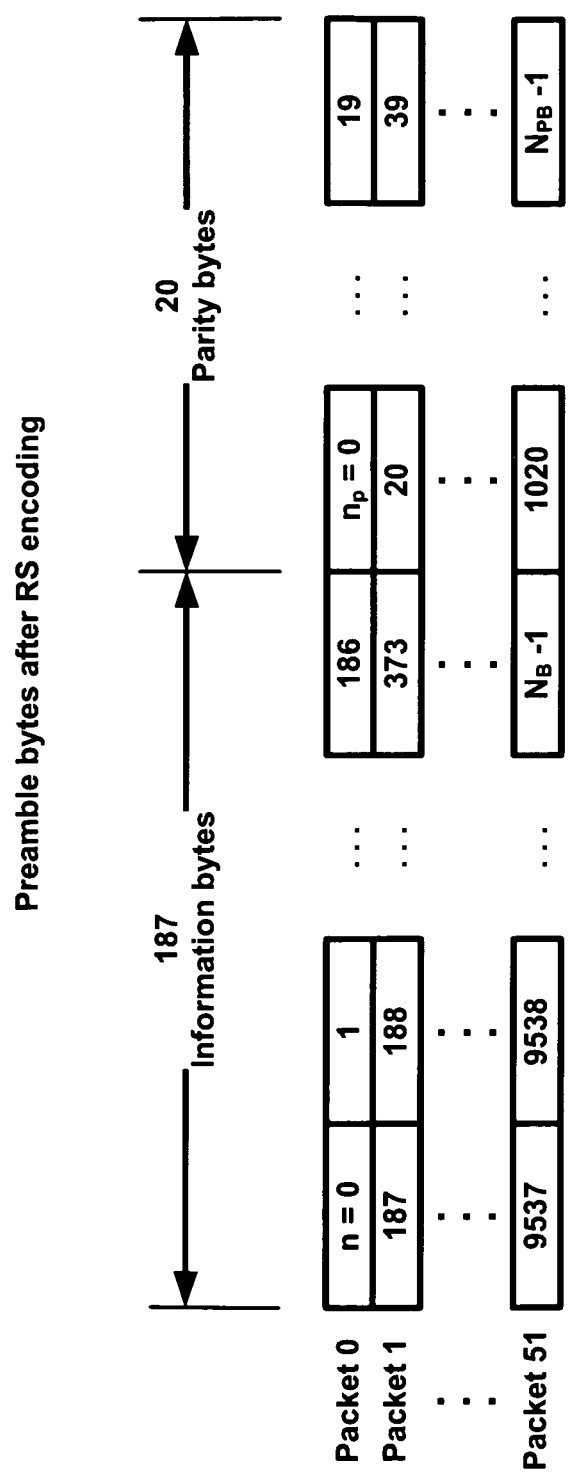
FIG. 12 shows the preamble after Reed Solomon encoding.

FIG. 12 shows the preamble after RS encoding. The $N_B$ preamble information bytes convey the above-described PN sequence to be re-created at the a priori processors of the receiver. These information bytes not only have the same relative positions as at the input of RS encoder 412, but also the same values, since the ATSC RS code is a systematic code. Hence, the byte numbering is kept the same. The parity bytes, which are also preamble bytes since they are derived from the information bytes, have a total number of $N_{BP}=52*20=1,040$, with byte numbers $n_p$, $0 \leq n_p \leq N_{BP}-1$. The parity bytes, like the information bytes, each have four dual-bits, as shown in FIG. 11.

Figure 13:
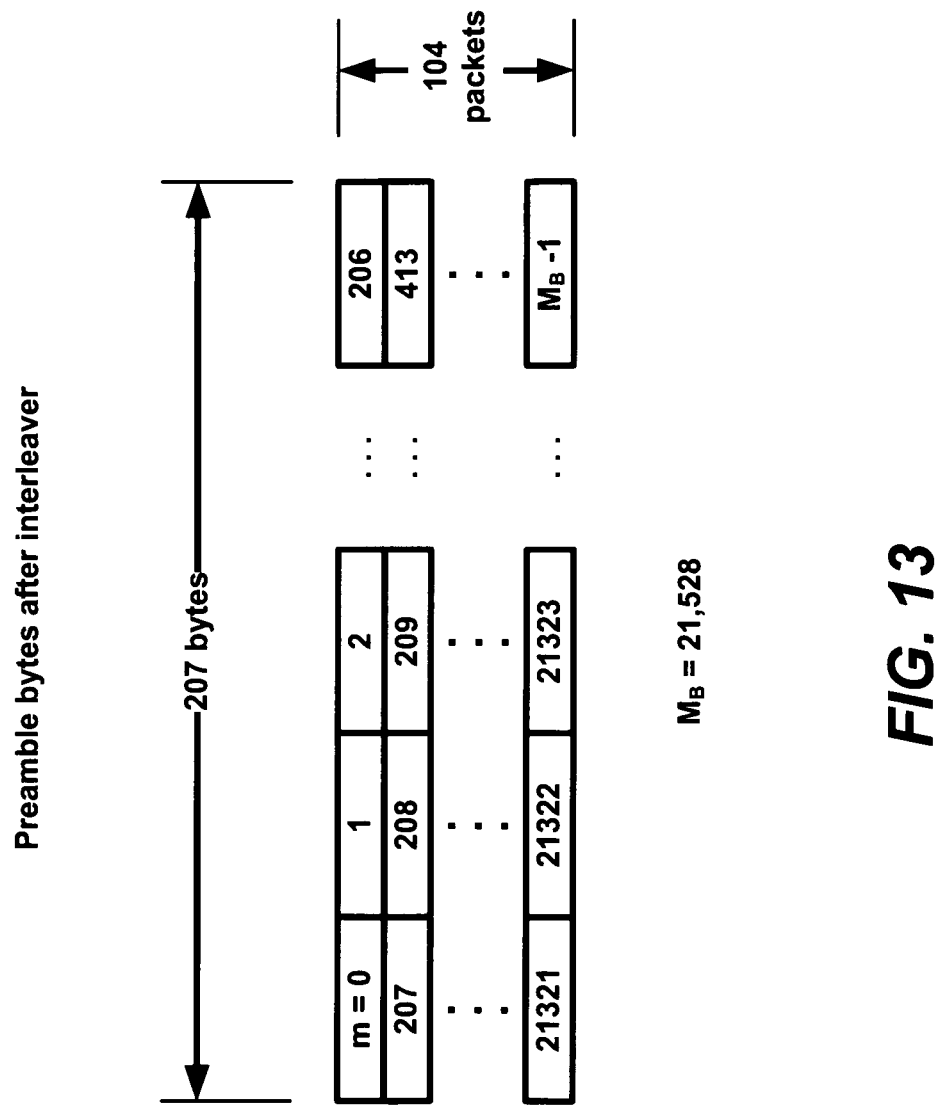
FIG. 13 shows the numbering of preamble bytes at the output of the byte interleaver of the legacy ATSC transmitter.

The preamble shown in FIG. 12 is spread throughout 104 packets at the output of interleaver 414, appearing as the white, diamond and triangle-shaped areas in FIG. 5. As shown in FIG. 13, we may number the bytes in the 104 packets of 207 bytes each, for a total number of bytes of $M_B=104*207=21,528$, with byte numbers m, $0 \leq m \leq M_B-1$. Also, each byte still satisfies the dual-bit structure of FIG. 11. Observe that $M_B=2*(N_B+N_{BP})$, since the preamble is spread over twice the number of packets or segments (104 from 52). Note, however, that there is a one-to-one relationship between each byte n, $0 \leq n \leq N_B-1$, and a corresponding position m, $0 \leq m \leq M_B-1$.

TABLE 2 shows the relationship between byte numbers at the input and output of interleaver 414. TABLE 2 below shows the corresponding m number values (output) for the first eight n number values (input) in the preamble of FIGS. 10 and 12.

TABLE 2

| | | | | n | | | | | |
|---|---|---|---|---|---|---|---|---|---|
| | 0 | 1 | 2 | 3 | 4 | 5 | 6 | 7 | 8 |
| m | 0 | 209 | 418 | 627 | 836 | 1045 | 1254 | 1463 | 1672 |

Hence, the preamble dual-bit at the location ($n=3, n_d=2$) before the randomizer 411, corresponds to the dual-bit at the location ($m=627$, $n_d=2$) after the interleaver 414.

Following interleaver 414, trellis encoder 416 encodes each of the 104 interleaved 207-byte preamble packets (FIG. 13) to produce a block of 828 3-bit symbols. FIG. 14 shows a block diagram of an illustrative implementation 1400 of trellis encoder 416 in an ATSC-compliant embodiment. The ATSC A53 standard specifies the use of twelve interleaved trellis encoders, wherein each trellis encoder is a ⅔-rate trellis encoder producing a 3-bit symbol for every dual-bit at its input. (See, ATSC Doc A/53, Annex D, section 4.2.5.) As shown in FIG. 14, trellis encoder 1400 includes de-multiplexer 1410, twelve parallel ⅔-rate trellis encoders and differential precoders (numbered 0-11), and multiplexer 1430. Data from interleaver 414 is de-multiplexed and distributed by de-multiplexer 1410 to the twelve trellis encoders. The 3-bit symbols generated by the twelve trellis encoders are multiplexed by multiplexer 1430 into a stream of 3-bit symbols. Each 3-bit symbol represents one dual-bit of information and one bit of trellis encoding overhead.

Figure 14:
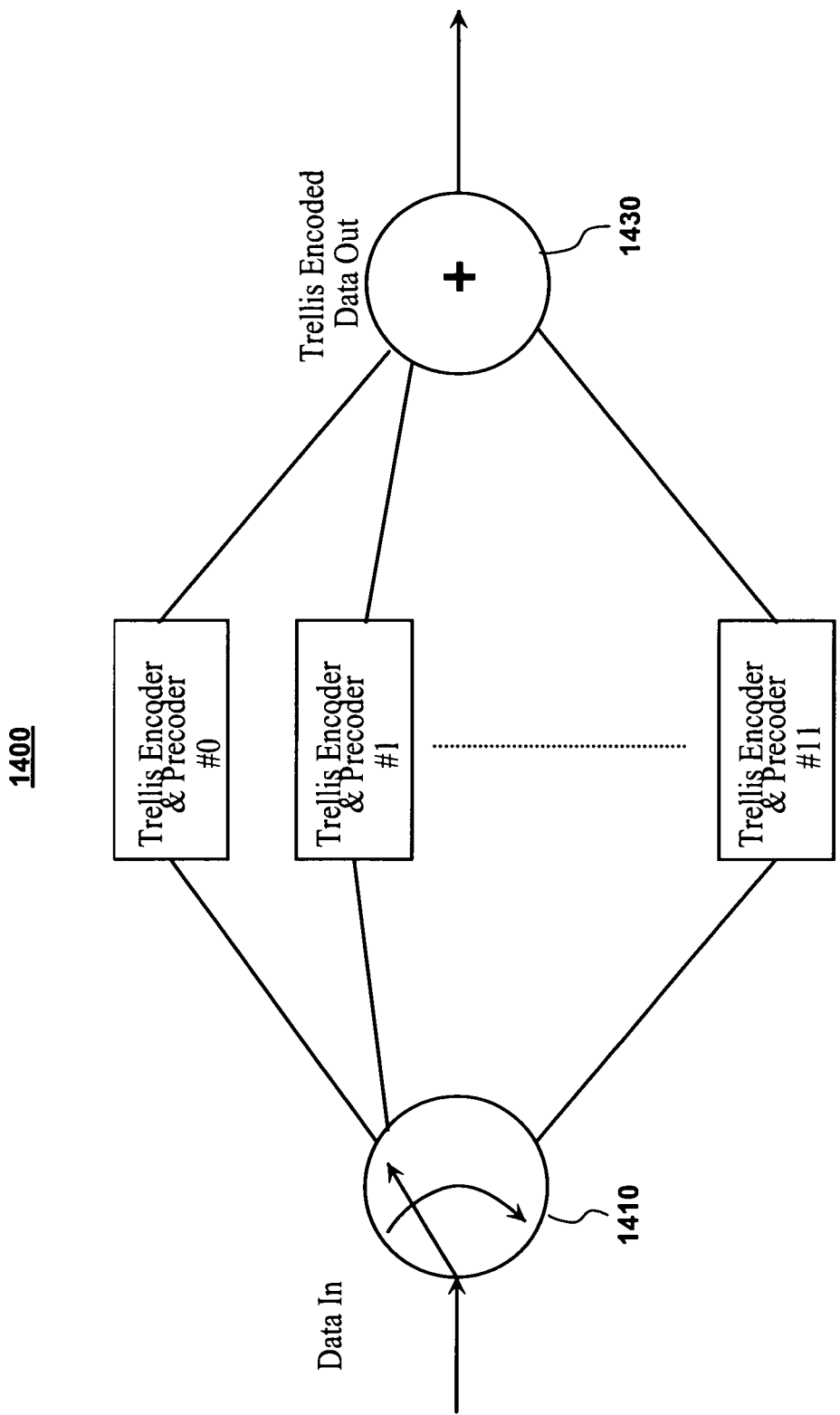
FIG. 14 is a block diagram of an ATSC standard trellis encoder.
Figure 15:
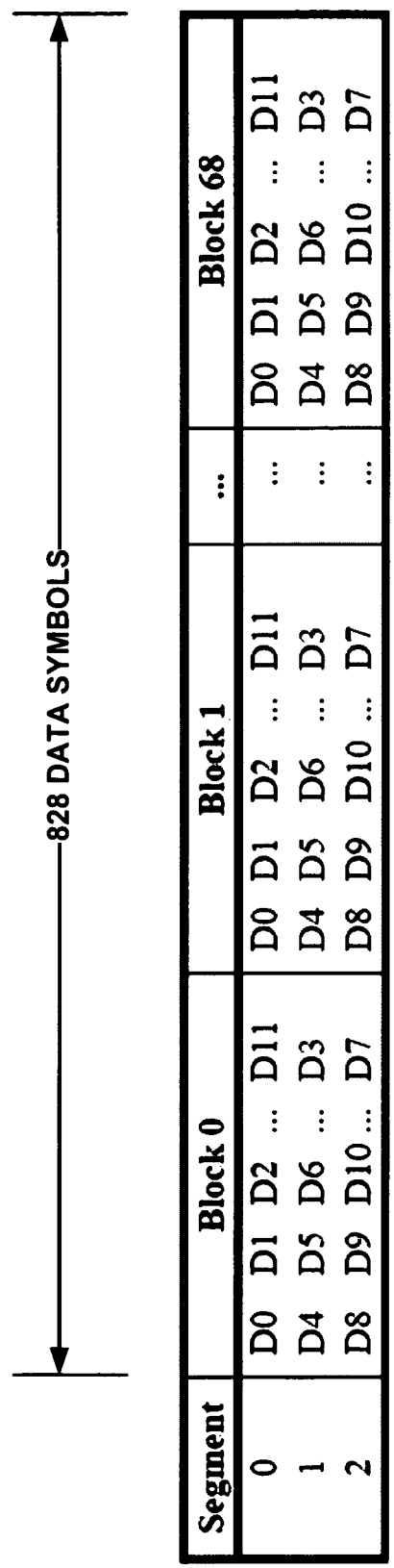
FIG. 15 shows the interleaving pattern of the trellis encoder of FIG. 14.

The twelve constituent trellis encoders of the ATSC-compliant trellis encoder 1400 of FIG. 14 operate in accordance with the interleaving pattern shown in FIG. 15. After the four-symbol data segment sync, the ordering of the 828 data symbols in each segment is such that symbols from each encoder 0-11 occur at a spacing of twelve symbols. In accordance with the interleaving pattern shown in FIG. 15, the 3-bit symbols at the output of multiplexer 1430 follow normal ordering from encoder 0 through 11 for the first segment of each data field, but on the second segment, the order changes and symbols are read from encoders 4 through 11, and then 0 through 3. The third segment reads from encoder 8 through 11 and then 0 through 7. This three-segment pattern repeats through the 312 data segments of each data field.

FIG. 16 shows a table detailing the byte-to-symbol conversion and the associated multiplexing of the twelve constituent trellis encoders 0-11. The number s of each of the 828 data symbols of each segment at the output of trellis encoder 1400 is indicated in the first column of the table. Segment 0 is the first segment of the data field. The pattern repeats every 12 segments. Segments 5 through 11 are not shown. FIG. 16 shows that there is a one-to-one relationship between the dual-bits at the input to trellis encoder 1400 and the symbols (containing the corresponding information dual-bits) at the output of trellis encoder 1400.

FIGS. 10-13, TABLE 2 and FIGS. 15 and 16 detail the one-to-one relationship between the location of the preamble dual-bits at the input to the data randomizer (101, 411) and the location of the dual-bits contained in each symbol at the output of the trellis encoder (116, 416). Given the above-described relationship, an exemplary method of creating a preamble or a priori training data sequence—for insertion before the data randomizer—which will appear as an ordered PN sequence in the preamble information dual-bits $(n, n_d)$ at the input of iterative FEC decoder 425 of the receiver, includes the following steps:

a. Select a PN sequence, preferably one already used in the ATSC standard such as PN63 or PN511.
  b. For each preamble information dual-bit $(n, n_d)$ at the input to the data randomizer (FIG. 10), obtain the corresponding symbol number s at the output of the trellis encoder (416), per FIGS. 10-13, TABLE 2 and FIGS. 15 and 16.
  c. Generate a list, in order of increasing value of s, listing all of the symbol numbers s associated with corresponding preamble information dual-bits $(n, n_d)$. Observe that not all symbol numbers s will have a corresponding preamble information dual-bit since only the bytes within the white regions of FIG. 5 are preamble bytes (of which some are preamble parity bytes and not associated with a PN sequence either).
  d. Associate successive dual-bits in the PN sequence to each successive symbol number s in the list generated in step c. For example, a PN63 sequence starts as "111001001011 . . . " If the list generated in step c starts as 2, 5, 7, . . . , then s=2 is associated with PN sequence dual-bit db_pn="11", s=5 is associated with PN sequence dual-bit db_pn="10", and s=7 is associated with PN sequence dual-bit db_pn="01".

e. Obtain the corresponding association between the preamble dual-bits (n, $n_d$) from the list of step c and the PN sequence dual-bits db_pn from step d. The PN sequence dual-bit corresponding to preamble dual-bit (n, $n_d$) is herein designated db_pn(n, $n_d$).

f. The randomizer output corresponding to preamble dual-bit (n, $n_d$) is herein designated db_r(n, $n_d$). Set db_r(n, $n_d$)=db_pn(n, $n_d$).

g. Obtain the preamble dual-bit value db(n, $n_d$) associated with each dual-bit (n, $n_d$) by derandomizing the corresponding value db_r(n, $n_d$) at the output of the randomizer obtained in step f. In an exemplary embodiment, the randomizer performs an exclusive-or (XOR) of the input with a known randomizing sequence, typically a PN sequence. (Because the operation A⊕B=C followed by C⊕B=A yields the original result, the derandomizer in the receiver also performs an XOR on the received data using the same randomizing sequence.) As such, the preamble dual bit value db(n, $n_d$) at the input to the randomizer is the XOR of db_r(n, $n_d$), as determined in step f, and the corresponding randomizing sequence dual-bit value for dual-bit (n, $n_d$). Thus, for example, if db_r(2, 3)="11" and the corresponding randomizing sequence value for dual-bit (2, 3) is "10", then the preamble dual-bit value db(2, 3) at the input to the randomizer is 11⊕10=01.

Once the entire a priori training sequence is created as described, it can be stored, for example, in a ROM in APT packet insertion block 402 in transmitter 400 and inserted before data randomizer 411 as preamble data in accordance with TABLE 1.

As can be appreciated, in an alternative exemplary embodiment in which the preamble training data is inserted at trellis encoder 416 and thus not subjected to randomization, RS encoding and interleaving, the above sequence creating method can be simplified accordingly.

As mentioned above, by using a preamble created in accordance with the above-described method, the iterative FEC decoder 425, and in particular the a priori processor 870 of each MAP decoder 600 of iterative FEC decoder 425, will see an ordered PN sequence (the PN sequence selected in step a) in the preamble information dual-bits. This allows for a simpler implementation of a priori processor 870 in the metric generator of FIG. 8 which will now be described with reference to FIG. 17.

Figure 17:
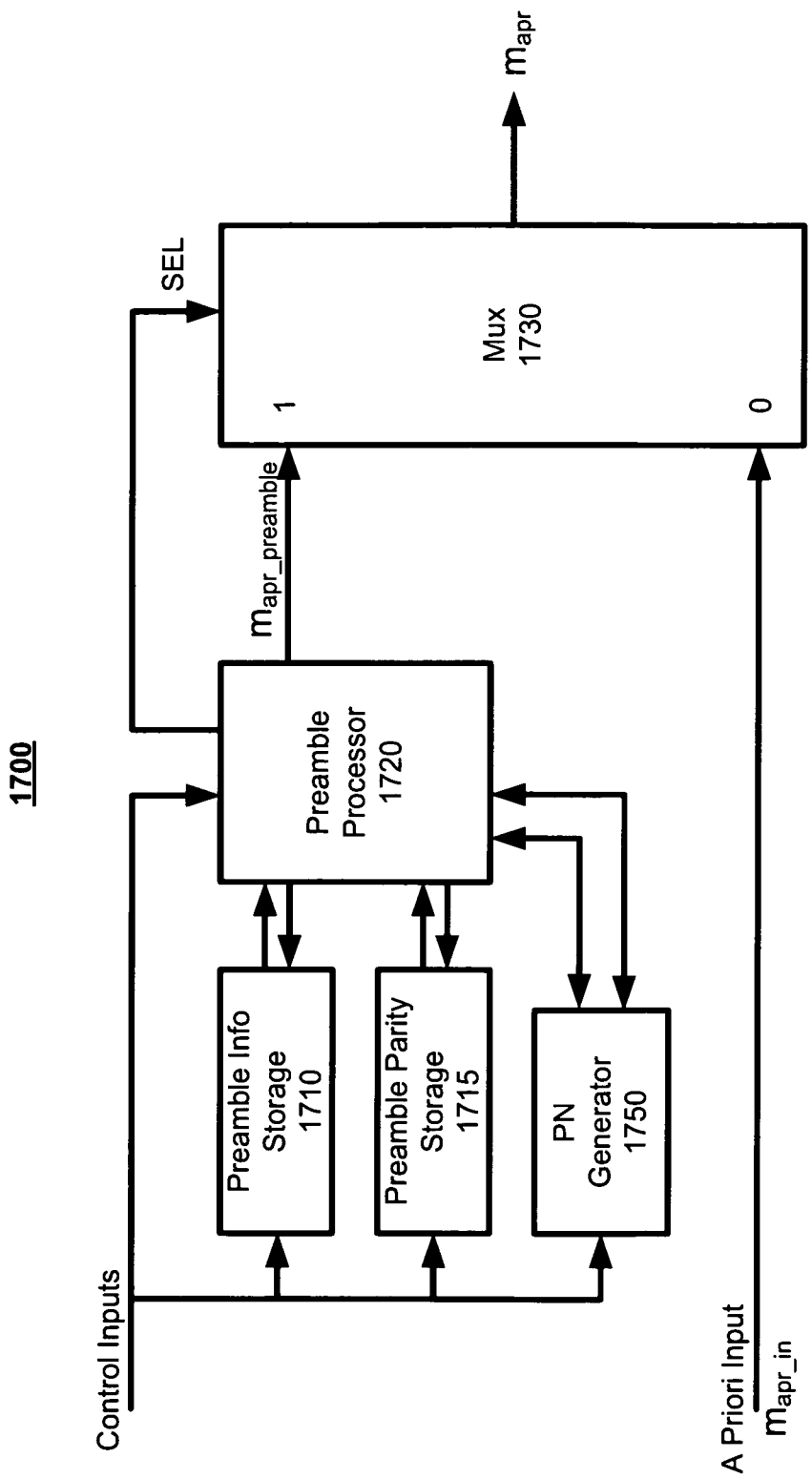
FIG. 17 shows a block diagram of an exemplary embodiment of an a priori processor.

FIG. 17 shows an illustrative implementation 1700 of a priori processor 870 adapted to operate with the above-described preamble data. A priori processor 1700 can be seen as having a first portion that handles the preamble information bytes (having the above-described PN sequence) and a second portion that handles the preamble RS parity bytes. The first portion includes preamble information storage 1710. Advantageously, storage 1710 need only contain the locations of the preamble information dual-bits (LOC_INFO). Instead of storing the dual-bit values (VAL)—as in storage 910 of the a priori processor implementation of FIG. 9—PN generator 1750 is provided to generate the values for the preamble information dual-bits (VAL_INFO). PN generator 1750 can be implemented relatively simply in known ways with shift registers, representing substantial savings in hardware compared to the additional preamble storage that would have otherwise been used to store the dual-bit values (VAL).

The second portion of a priori processor 1700, which handles the preamble RS parity bytes, includes preamble parity storage 1715. Preamble parity storage 1715 contains the locations of the preamble parity dual-bits (LOC_PAR) and the preamble parity dual-bit values (VAL_PAR). This is similar to the contents of storage 910 of a priori processor 900, but need only include data for the substantially fewer parity bytes (i.e., 1,040 parity bytes vs. 9,724 information bytes).

In an exemplary embodiment, preamble processor 1720, which can be implemented for example as a state machine or as a processor unit executing program instructions, performs the following method:

1. At the beginning of Data Field F0, such as concurrently with the arrival of the Data Field Sync segment (FIG. 3) thereof, reset a symbol counter (S_COUNT=0), an address pointer (ADDR_INFO=0) for preamble information storage 1710, and an address pointer (ADDR_PAR=0) for preamble parity storage 1715.
2. Compare the symbol counter value (S_COUNT) with the preamble information location (LOC_INFO) stored in storage 1710 at address ADDR_INFO.
3. If S_COUNT=LOC_INFO, then perform steps 3*a*-3*e*, else go to step 4.
   a. In accordance with Eq. 2, generate the preamble a priori metrics $m_{apr\_preamble}$ based on the output of PN Generator 1750. Preamble processor 1720 obtains the dual-bit value (VAL_INFO) from PN generator 1750 associated with the location (LOC_INFO) stored in storage 1710 at address ADDR_INFO. The preamble a priori metrics $m_{apr\_preamble}$ generated by preamble processor 1720 have the correct values for the corresponding preamble symbol. For example, if for a particular location LOC_INFO the corresponding VAL_INFO is "01", then the four values of the preamble a priori metrics $m_{apr\_preamble}$ will be determined by setting P(VAL_INFO="01")=1 and P(VAL_INFO="00")=P(VAL_INFO="10")=P(VAL_INFO="11")=0 in the expression of Eq. 2. For 6-bit unsigned $m_{apr\_preamble}$ values, this may translate, for example, to $m_{apr\_preamble}$(VAL_INFO="01")= $V_0$=0 and $m_{apr\_preamble}$(VAL_INFO="00")=$m_{apr\_preamble}$(VAL_INFO="10")=$m_{apr\_preamble}$(VAL_INFO="11")=$V_1$=63.
   b. Set SEL=1 and pass preamble a priori metrics $m_{apr\_preamble}$ to a priori metric storage 840 (FIG. 8) via mux 1730. The preamble a priori metrics $m_{apr\_preamble}$ thereby replace the input a priori metrics $m_{apr\_in}$ of the received stream for the preamble symbols.
   c. Increment the symbol counter (S_COUNT=S_COUNT+1) on every input 8-VSB data symbol. The value of S_COUNT does not need to increment over the three data fields of TABLE 1, but may stop on the last symbol position where the byte interleaved preamble dual-bits will appear, which, in one embodiment, may be somewhere in the first half of Data Field F1 for the burst data structure in TABLE 1. This position is represented by S_COUNT_MAX. Once S_COUNT reaches this value, preamble processing ends for Data Field F0.
   d. If ADDR_INFO<ADDR_INFO_MAX, increment the preamble information storage address pointer (i.e., ADDR_INFO=ADDR_INFO+1). For 52 preamble packets with 187 byte packets (FIG. 12), ADDR_INFO_MAX=187×52=9,724.
   e. Return to step 1.
4. Compare the symbol counter value (S_COUNT) with the preamble parity location (LOC_PAR) stored in storage 1715 at address ADDR_PAR.
5. If S_COUNT=LOC_PAR, then perform steps 5*a*-5*e*, else go to step 6.

a. In accordance with Eq. 2, generate preamble a priori metrics $m_{apr\_preamble}$ based on VAL_PAR stored in preamble parity storage 1715 at ADDR_PAR. Preamble processor 1720 reads the dual-bit value (VAL_PAR) stored in preamble parity storage 1715 associated with the location (LOC_PAR) stored at address (ADDR_PAR). The preamble a priori metrics $m_{apr\_preamble}$ generated by preamble processor 1720 have the correct values for the corresponding preamble symbol. For example, if for a particular location (LOC_PAR) the dual-bit VAL_PAR is "10", then the four values of the preamble a priori metrics $m_{apr\_preamble}$ will be determined by setting P(VAL_PAR="10")=1 and P(VAL_PAR="00")=P(VAL_PAR="01")=P(VAL_PAR="11")=0. For 6-bit unsigned $m_{apr\_preamble}$ values, this may translate, for example, to $m_{apr\_preamble}$(VAL_PAR="10")=$V_0$=0 and $m_{apr\_preamble}$(VAL_PAR="00")=$m_{apr\_preamble}$(VAL_PAR="01")=$m_{apr\_preamble}$(VAL_PAR="11")=$V_1$=63.

b. Set SEL=1 and pass preamble a priori metrics $m_{apr\_preamble}$ to a priori metric storage 840 (FIG. 8) via mux 1730. The preamble a priori metrics $m_{apr\_preamble}$ thereby replace the input a priori metrics $m_{apr\_in}$ of the received stream for the preamble symbols.

c. Increment the symbol counter (S_COUNT=S_COUNT+1) on every input 8-VSB data symbol. As in step 3c above, the value of S_COUNT does not need to increment over the three data fields of TABLE 1, but may go up to S_COUNT_MAX, representing the one symbol after the last symbol position where the byte interleaved preamble dual-bits will appear. Once S_COUNT reaches this value, preamble processing ends for Data Field F0.

d. If ADDR_PAR<ADDR_PAR_MAX, increment the Preamble parity storage address pointer (i.e., ADDR_PAR=ADDR_PAR+1). For 52 preamble packets with 20 bytes of RS parity each (FIG. 12), ADDR_PAR_MAX=20×52=1,040.

e. Return to step 1.

6. If S_COUNT≠LOC_INFO and S_COUNT≠LOC_PAR, then:

a. Set SEL=0 and pass the input a priori metric $m_{apr\_in}$ from the previous iteration to a priori metric storage 840 (FIG. 8) via mux 1730.

b. Return to step 1.

Mux 1730 sends the a priori metrics $m_{apr\_preamble}$ from preamble processor 1720 or the metrics $m_{apr\_in}$ from the previous iteration of the FEC decoder to a priori metric storage 840, depending on the state of signal SEL, according to the above method. For the first metric generator in the iterative FEC chain, the input a priori metrics are set to 0. Note that the preamble a priori metrics $m_{apr\_preamble}$ generated by preamble processor 1720 are available to MAP decoder 600 starting with the first core in the FEC decoding chain.

Note that although preamble information storage 1710 and preamble parity storage 1715 are shown as separate blocks, they may be contained in the same memory.

In an exemplary embodiment, instead of storing the locations of the preamble dual-bits (LOC_INFO, LOC_PAR), preamble information storage 1710 and preamble parity storage 1715 store location bits INFO_BIT_LOC, and PAR_BIT_LOC, for each dual-bit position in the received stream which may contain a preamble dual-bit; e.g., starting with the first dual-bit position in which a preamble dual-bit appears and ending with the last dual-bit position in which a preamble dual-bit appears. The value of the location bit may be '1' when the dual-bit position corresponds to a preamble dual-bit and '0' otherwise. For dual-bit positions for which INFO_BIT_LOC is '1', the corresponding value of the dual-bit, VAL_INFO is obtained by preamble processor 1720 from PN generator 1750, For dual-bit positions for which PAR_BIT_LOC is '1', the corresponding value of the dual-bit, VAL_PAR, is stored in preamble parity storage 1715, for access by preamble processor 1720. As such, each of the bits INFO_BIT_LOC, and PAR_BIT_LOC serves as an indicator to indicate the presence or absence of training information and parity, respectively, for each trellis encoded symbol position.

The a priori processor architecture for a MAP decoder for the ATSC-DTV trellis code discussed above takes advantage of the encoded preamble training data present in a mobile ATSC-DTV system to enhance the performance of all MAP decoder iterations in an iterative (turbo) decoding receiver implementation. In one embodiment, this architecture has been implemented in VHDL and utilized in a prototype for a mobile ATSC-DTV receiver. The concepts used in this invention can be extended to other iteratively decoded systems, and data frame and preamble training structures.

The implementations described herein may be implemented in, for example, a method or process, an apparatus, or a combination of hardware and software or hardware and firmware. Even if only discussed in the context of a single form of implementation, the implementation of features discussed may also be implemented in other forms (for example, an apparatus or a program executed in a computer). An apparatus may be implemented in, for example, appropriate hardware, software, and firmware. The methods may be implemented in, for example, an apparatus such as, for example, a processor, which refers to processing devices in general, including, for example, a computer, a microprocessor, an integrated circuit, or a programmable logic device. Processing devices also include communication devices, such as, for example, computers, cell phones, portable/personal digital assistants ("PDAs"), and other devices that facilitate communication of information between end-users.

Implementations of the various processes and features described herein may be embodied in a variety of different equipment or applications, particularly, for example, equipment or applications associated with data transmission and reception. Examples of equipment include video coders, video decoders, video codecs, web servers, set-top boxes, laptops, personal computers, and other communication devices. As should be clear, the equipment may be mobile and even installed in a mobile vehicle.

Additionally, the methods may be implemented by instructions being performed by a processor, and such instructions may be stored on a processor-readable medium such as, for example, an integrated circuit, a software carrier or other storage device such as, for example, a hard disk, a compact diskette, a random access memory ("RAM"), a read-only memory ("ROM") or any other magnetic optical, or solid state media. The instructions may form an application program tangibly embodied on a processor-readable medium such as any of the media listed above. As should be clear, a processor may include, as part of the processor unit, a processor-readable medium having, for example, instructions for carrying out a process.

The invention claimed is:

1. An apparatus for decoding a data stream, the data stream organized in blocks of symbols, wherein the data stream is encoded by a digital encoder processor comprising a plurality of deterministic processing units followed by a trellis encoder, the apparatus comprising:

a preamble processor for determining a location of training data in the data stream and generating the data associated with the location using a pseudo noise (PN) sequence generator, wherein the preamble processor receives an ordered PN sequence that is regenerated using the PN sequence generator, the regenerated PN sequence used to generate metric information; and a multiplexer for selectively providing the metric information received from the preamble processor or from an input stream of metric information previously determined;

wherein the metric information provided by the multiplexer is provided to a metric generator of a maximum a posteriori (MAP) decoder to decode the data stream, and wherein the preamble processor identifies which trellis symbol positions s within a symbol block of size S ($0 \leq s < S$) are associated with a presence of training data bits b at the trellis encoder input, provides a one-to-one mapping between each trellis encoded symbol position s within the symbol block of size S and b training data bits which are inputs to the trellis encoder when the corresponding trellis encoded symbol is generated, counts the symbols on each symbol block of size S using a symbol counter, and outputs $2^b$ values m(I) for each trellis encoded symbol, wherein $0 \leq I < 2^b$, where $b \geq 1$ and each m(I) represents an metric information value.

2. The apparatus of claim 1, further comprising a memory storing location information indicating the location of the training data in the data stream.

3. The apparatus of claim 1, wherein the training data includes parity data and the preamble processor generates the parity data based on parity data value information stored in a memory.

4. The apparatus of claim 1, wherein:
m(I)=$V_0$ if the symbol counter value s is such that an equivalent value of the corresponding b training bits is equal to I;
m(I)=$V_1$ if the symbol counter value is such that an equivalent value of the corresponding b training bits is not equal to I or if there are no training bits associated with a particular trellis coded symbol, wherein $V_0$ and $V_1$ are predetermined values.

5. The apparatus of claim 1, wherein the preamble processor identifies which trellis symbol positions s within the symbol block of size S are associated with the presence of training data bits at the trellis encoder input using an indicator for indicating the presence or absence of training data bits for each trellis encoded symbol position s in the symbol block of size S.

6. The apparatus of claim 1, wherein the preamble processor provides a one-to-one mapping between each trellis encoded symbol position s within the symbol block of size S and the b training data bits using a memory containing the b training data bits associated with each trellis encoded symbol position s in the symbol block of size S for which training bits are present.

7. The apparatus of claim 1, wherein the digital encoder processor includes a convolutional interleaver.

8. The apparatus of claim 1, wherein the digital encoder processor includes a randomizer.

9. The apparatus of claim 1, wherein the digital encoder processor is in accordance with an Advanced Television Systems Committee (ATSC) standard for digital television (DTV).

* * * * *